United States Patent
Kuroiwa et al.

(10) Patent No.: US 11,402,755 B2
(45) Date of Patent: Aug. 2, 2022

(54) CHEMICALLY AMPLIFIED POSITIVE-TYPE PHOTOSENSITIVE RESIN COMPOSITION, METHOD FOR MANUFACTURING SUBSTRATE WITH TEMPLATE, AND METHOD FOR MANUFACTURING PLATED ARTICLE

(71) Applicant: TOKYO OHKA KOGYO CO., LTD., Kawasaki (JP)

(72) Inventors: Yasushi Kuroiwa, Kawasaki (JP); Yuta Yamamoto, Kawasaki (JP)

(73) Assignees: Tokyo Ohka Kogyo Co., Ltd., Kawasaki (JP); Tokyo Institute of Technology, Tokyo (JP)

( * ) Notice: Subject to any disclaimer, the term of this patent is extended or adjusted under 35 U.S.C. 154(b) by 342 days.

(21) Appl. No.: 16/294,254

(22) Filed: Mar. 6, 2019

(65) Prior Publication Data
US 2019/0278178 A1 Sep. 12, 2019

(30) Foreign Application Priority Data
Mar. 12, 2018 (JP) .............................. JP2018-044007

(51) Int. Cl.
| | | |
|---|---|---|
| *G03F 7/039* | (2006.01) | |
| *G03F 7/004* | (2006.01) | |
| *G03F 7/38* | (2006.01) | |
| *C08K 5/435* | (2006.01) | |
| *G03F 7/20* | (2006.01) | |
| *C08L 61/06* | (2006.01) | |
| *C08L 33/08* | (2006.01) | |
| *C08L 33/10* | (2006.01) | |
| *C08L 25/18* | (2006.01) | |
| *G03F 7/085* | (2006.01) | |
| *G03F 7/30* | (2006.01) | |

(52) U.S. Cl.
CPC ............ *G03F 7/0392* (2013.01); *C08K 5/435* (2013.01); *C08L 25/18* (2013.01); *C08L 33/08* (2013.01); *C08L 33/10* (2013.01); *C08L 61/06* (2013.01); *G03F 7/0045* (2013.01); *G03F 7/0397* (2013.01); *G03F 7/085* (2013.01); *G03F 7/2022* (2013.01); *G03F 7/30* (2013.01); *G03F 7/38* (2013.01)

(58) Field of Classification Search
CPC .... G03F 7/0392; G03F 7/0397; G03F 7/0045; G03F 7/30; G03F 7/38
See application file for complete search history.

(56) References Cited

U.S. PATENT DOCUMENTS

| | | | | |
|---|---|---|---|---|
| 6,409,328 | B1* | 6/2002 | Ohkawa | B41M 5/30 347/100 |
| 10,890,845 | B2* | 1/2021 | Ebisawa | G03F 7/0392 |
| 2014/0154624 | A1* | 6/2014 | Liu | G03F 7/0397 430/270.1 |
| 2015/0086927 | A1 | 3/2015 | Sugihara et al. | |
| 2015/0268553 | A1* | 9/2015 | Katayama | G03F 7/0045 430/285.1 |
| 2015/0315379 | A1* | 11/2015 | Ueda | G03F 7/004 522/58 |
| 2017/0137605 | A1* | 5/2017 | Suzuki | C09D 4/00 |
| 2019/0064662 | A1* | 2/2019 | Liu | G03F 7/0392 |
| 2020/0183278 | A1* | 6/2020 | Toukhy | G03F 7/0392 |

FOREIGN PATENT DOCUMENTS

| | | |
|---|---|---|
| JP | 2004-347951 A | 12/2004 |
| JP | 2015-087759 A | 5/2015 |
| WO | WO 2015/064556 A1 | 5/2015 |

* cited by examiner

*Primary Examiner* — John S Chu
(74) *Attorney, Agent, or Firm* — Knobbe Martens Olson & Bear LLP

(57) ABSTRACT

A chemically amplified positive-type photosensitive resin composition capable of forming a resist pattern having excellent cross-sectional perpendicularity of a nonresist section even when a resist pattern is formed on a metal surface, and a method for manufacturing a substrate with a template and a method for manufacturing a plated article using the composition. The composition contains an acid generator, a resin, and a sulfur-containing compound including a sulfur-containing compound and a thiol compound that is different from the sulfur-containing compound.

7 Claims, No Drawings

CHEMICALLY AMPLIFIED POSITIVE-TYPE PHOTOSENSITIVE RESIN COMPOSITION, METHOD FOR MANUFACTURING SUBSTRATE WITH TEMPLATE, AND METHOD FOR MANUFACTURING PLATED ARTICLE

RELATED APPLICATIONS

This claims the benefit priority to Japanese Patent Application No. 2018-044007, filed Mar. 12, 2018, the entire content of which is incorporated herein by reference.

BACKGROUND OF THE INVENTION

Field of the Invention

The present invention relates to a chemically amplified positive-type photosensitive resin composition, a method for manufacturing a substrate with a template, and a method for manufacturing a plated article.

Related Art

Photofabrication is now the mainstream of a microfabrication technique. Photofabrication is a generic term describing the technology used for manufacturing a wide variety of precision components such as semiconductor packages. The manufacturing is carried out by applying a photosensitive resin composition to the surface of a processing target to form a photosensitive resin layer, patterning this photosensitive resin layer using photolithographic techniques, and then conducting electroforming based mainly on, for example, chemical etching and electroplating, and the like, using the patterned photosensitive resin layer (resist pattern) as a mask.

Furthermore, in recent years, high density packaging technologies have progressed in semiconductor packages, and the increase in package density has been developed on the basis of mounting multi-pin thin film in packages, miniaturizing of package size, two-dimensional packaging technologies in flip-tip systems or three-dimensional packaging technologies. In these types of high density packaging techniques, connection terminals, including protruding electrodes (mounting terminals) known as bumps that protrude above the package or metal posts that extend from peripheral terminals on the wafer and connect rewiring with the mounting terminals, are disposed on the surface of the substrate with high precision.

Incidentally, as the photosensitive resin composition to be used in photofabrication, a chemically amplified positive-type photosensitive resin composition containing an acid generator is known (see, for example, Patent Document 1). In the chemically amplified positive-type photosensitive resin composition, an acid is generated from the acid generator upon irradiation with radiation (exposure) to cause an acid catalytic reaction with a base resin in the composition resulting in an increase in alkali-solubility.

These chemically amplified positive-type photosensitive resin compositions are used for manufacturing, for example, plated articles such as bumps and metal posts by a plating process. Specifically, a photosensitive resin layer is formed on a support such as a metal substrate using a chemically amplified positive-type photosensitive resin composition, and the photosensitive resin layer is exposed through a predetermined mask pattern and then developed to form a resist pattern in which portions for forming bumps and metal posts have been selectively removed (stripped). Then, bumps and metal posts can be manufactured by embedding a conductor such as copper into the removed portions (nonresist sections) by plating, and then removing the surrounding residual resist pattern.

Patent Document 1: Japanese Unexamined Patent Application, Publication No. 2004-347951

SUMMARY OF THE INVENTION

When a plated article such as a bump and a metal post is manufactured by a plating process, a nonresist section of a resist pattern serving as a template is desired to have excellent cross-sectional perpendicularity. When the nonresist section of the resist pattern has excellent cross-sectional perpendicularity, the obtained plated article also has excellent perpendicularity.

However, when a resist pattern is formed on a metal substrate using a conventional chemically amplified positive-type photosensitive resin composition disclosed in Patent Document 1 or the like, it cannot be said that the cross-sectional perpendicularity of the nonresist section of the resist pattern has not been sufficient, and there is room for improvement.

The present invention has been made in view of the above circumstances, and has an object to provide a chemically amplified positive-type photosensitive resin composition capable of forming a resist pattern having excellent cross-sectional perpendicularity of a nonresist section even when resist pattern is formed on a metal surface, and a method for manufacturing a substrate with a template along with a method for manufacturing a plated article using the chemically amplified positive-type photosensitive resin composition.

After conducting extensive studies in order to achieve the above objects, the present inventors have found that the above problem can be solved by including a specific sulfur-containing compound in a chemically amplified positive-type photosensitive resin composition, and have completed the present invention. Specifically, the present invention provides the following.

A first aspect of the present invention is a chemically amplified positive-type photosensitive resin composition including: an acid generator (A) that produces an acid by irradiation with an active ray or radiation, a resin (B) whose solubility in alkali increases under an action of acid, and a sulfur-containing compound (C). The above sulfur-containing compound (C) includes a sulfur-containing compound (C1), and a thiol compound (C2) that is different from the above sulfur-containing compound (C1), and the above sulfur-containing compound (C1) is a compound represented by at least one of the following formulae (c1-1) and (c1-2):

[Chem. 1]

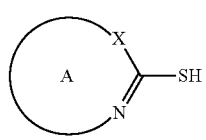

(c1-1)

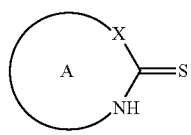

(c1-2)

(In the formulae (c1-1) and (c1-2), a ring A is a monocyclic ring having 4 or more and 8 or less ring-forming atoms, or a polycyclic ring having 5 or more and 20 or less ring-forming atoms, X is —CR$^{1c}$R$^{2c}$—, —NR$^{3c}$—, —O—, —S—, —Se—, —Te—, =CR$^{4c}$, or =N—, and R$^{1c}$, R$^{2c}$, R$^{3c}$, and R$^{4c}$ each independently represents a hydrogen atom, a halogen atom, a nitro group, a cyano group, or an organic group;

where the compound represented by the formula (c1-1) has one mercapto group in a molecule and does not have a hydroxyl group; and the compound represented by the formula (c1-2) does not have a mercapto group and a hydroxyl group in a molecule).

A second aspect of the present invention is a method for manufacturing a substrate with a template, the method including: forming a photosensitive resin layer on a metal surface of a substrate having the metal surface, the photosensitive resin layer comprising the chemically amplified positive-type photosensitive resin composition according to the first aspect;
irradiating the photosensitive resin layer with an active ray or radiation to perform exposure; and
developing the photosensitive resin layer after the exposure to create a template for forming a plated article.

A third aspect of the present invention is a method for manufacturing a plated article, the method including: plating the substrate with a template manufactured by the method according to the second aspect to form the plated article within the template.

The present invention can provide a chemically amplified positive-type photosensitive resin composition capable of forming a resist pattern having excellent cross-sectional perpendicularity of a nonresist section even when resist pattern is formed on a metal surface and a method for manufacturing a substrate with a template along with a method for manufacturing a plated article using the chemically amplified positive-type photosensitive resin composition.

DETAILED DESCRIPTION OF THE INVENTION

<<Chemically Amplified Positive-Type Photosensitive Resin Composition>>

The chemically amplified positive-type photosensitive resin composition (hereinafter also referred to as a "photosensitive resin composition") includes
an acid generator (A) capable of producing an acid by irradiation with an active ray or radiation (hereinafter also referred to as the "acid generator (A)"),
the resin (B) whose solubility in alkali increases under the action of acid (hereinafter also referred to as the "resin (B)"),
and a sulfur-containing compound (C). The photosensitive resin composition may contain a component such as an alkali soluble resin (D), an acid diffusion suppressing agent (E), and an organic solvent (S), if necessary.

Below, essential or optional components contained in the photosensitive resin composition and a method for preparing the photosensitive resin composition are described sequentially.

<Acid Generator (A)>

The acid generator (A) is a compound capable of producing an acid by irradiation with an active ray or radiation, and is not particularly limited as long as it is a compound which directly or indirectly produces an acid under the action of light. The acid generator (A) is preferably any one of the acid generators of the first to fifth aspects that will be described below.

The first aspect of the acid generator (A) may be a compound represented by the following formula (a1).

[Chem. 2]

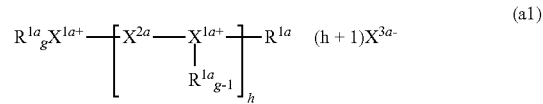

(a1)

In the above formula (a1), $X^{1a}$ represents a sulfur atom or iodine atom respectively having a valence of g; g represents 1 or 2. h represents the number of repeating units in the structure within parentheses. $R^{1a}$ represents an organic group that is bonded to $X^{1a}$, and represents an aryl group having 6 or more and 30 or less carbon atoms, a heterocyclic group having 4 or more and 30 or less carbon atoms, an alkyl group having 1 or more and 30 or less carbon atoms, an alkenyl group having 2 or more and 30 or less carbon atoms, or an alkynyl group having 2 or more and 30 or less carbon atoms. $R^{1a}$ may be substituted with at least one selected from the group consisting of an alkyl group, a hydroxyl group, an alkoxy group, an alkylcarbonyl group, an arylcarbonyl group, an alkoxycarbonyl group, an aryloxycarbonyl group, an arylthiocarbonyl group, an acyloxy group, an arylthio group, an alkylthio group, an aryl group, a heterocyclic group, an aryloxy group, an alkylsulfinyl group, an arylsulfinyl group, an alkylsulfonyl group, an arylsulfonyl group, an alkyleneoxy group, an amino group, a cyano group, a nitro group, and halogen atoms. The number of $R^{1a}$s is g+h(g−1)+1, and the $R^{1a}$s may be respectively identical to or different from each other. Furthermore, two or more $R^{1a}$s may be bonded to each other directly or via —O—, —S—, —SO—, —SO$_2$—, —NH—, —NR$^{2a}$—, —CO—, —COO—, —CONH—, an alkylene group having 1 or more and 3 or less carbon atoms, or a phenylene group, and may form a ring structure including $X^{1a}$. $R^{2a}$ represents an alkyl group having 1 or more and 5 or less carbon atoms, or an aryl group having 6 or more and 10 or less carbon atoms.

$X^{2a}$ represents a structure represented by the following formula (a2).

[Chem. 3]

(a2)

In the above formula (a2), $X^{4a}$ represents an alkylene group having 1 or more and 8 or less carbon atoms, an arylene group having 6 or more and 20 or less carbon atoms, or a divalent group of a heterocyclic compound having 8 or more and 20 or less carbon atoms. $X^{4a}$ may be substituted with at least one selected from the group consisting of an alkyl group having 1 or more and 8 or less carbon atoms, an alkoxy group having 1 or more and 8 or less carbon atoms, an aryl group having 6 or more and 10 or less carbon atoms, a hydroxyl group, a cyano group, a nitro group, and halogen atoms. $X^{5a}$ represents —O—, —S—, —SO—, —SO$_2$—, —NH—, —NR$^{2a}$—, —CO—, —COO—, —CONH—, an alkylene group having 1 or more and 3 or less carbon atoms, or a phenylene group. h represents the number of repeating units of the structure in parentheses. h represents an integer of 0 or more. $X^{4a}$s in the number of h+1 and $X^{5a}$s in the number of h may be identical to or different from each other. $R^{2a}$ has the same definition as described above.

$X^{3a-}$ represents a counterion of an onium, and examples thereof include a fluorinated alkylfluorophosphoric acid anion represented by the following formula (a17) or a borate anion represented by the following formula (a18).

[Chem. 4]

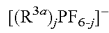
$$[(R^{3a})_j PF_{6-j}]^-$$ (a17)

In the above formula (a17), $R^{3a}$ represents an alkyl group having 80% or more of the hydrogen atoms substituted by fluorine atoms.

j represents the number of $R^{3a}$s and is an integer of 1 or more and 5 or less. $R^{3a}$s in the number of j may be respectively identical to or different from each other.

[Chem. 5]

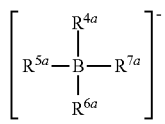
(a18)

In the above formula (a18), $R^{4a}$ to $R^{7a}$ each independently represents a fluorine atom or a phenyl group. A part or all of the hydrogen atoms of the phenyl group may be substituted by at least one selected from the group consisting of a fluorine atom and a trifluoromethyl group.

Examples of the onium ion in the compound represented by the above formula (a1) include triphenylsulfonium, tri-p-tolylsulfonium, 4-(phenylthio)phenyldiphenylsulfonium, bis[4-(diphenylsulfonio)phenyl] sulfide, bis[4-{bis[4-(2-hydroxyethoxy)phenyl]sulfonio}phenyl] sulfide, bis{4-[bis(4-fluorophenyl)sulfonio]phenyl}sulfide, 4-(4-benzoyl-2-chlorophenylthio)phenylbis(4-fluorophenyl) sulfonium, 7-isopropyl-9-oxo-10-thia-9,10-dihydroanthran-2-yldi-p-tolylsulfonium, 7-isopropyl-9-oxo-10-thia-9,10-dihydroanthracen-2-yldiphenylsulfonium, 2-[(diphenyl)sulfonio]thioxanthone, 4-[4-(4-tert-butylbenzoyl)phenylthio]phenyldi-p-tolylsulfonium, 4-(4-benzoylphenylthio) phenyldiphenylsulfonium, diphenylphenacylsulfonium, 4-hydroxyphenylmethylbenzylsulfonium, 2-naphthylmethyl(1-ethoxycarbonyl)ethylsulfonium, 4-hydroxyphenylmethylphenacylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl] diphenylsulfonium, octadecylmethylphenacylsulfonium, diphenyliodonium, di-p-tolyliodonium, bis(4-dodecylphenyl)iodonium, bis(4-methoxyphenyl)iodonium, (4-octyloxyphenyl)phenyliodonium, bis(4-decyloxy)phenyliodonium, 4-(2-hydroxytetradecyloxy)phenylphenyliodonium, 4-isopropylphenyl(p-tolyl)iodonium, 4-isobutylphenyl(p-tolyl)iodonium, and the like.

Among the onium ions in the compound represented by the above formula (a1), a preferred onium ion may be a sulfonium ion represented by the following formula (a19).

[Chem. 6]

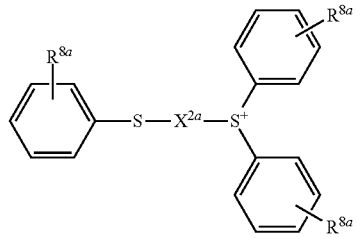
(a19)

In the above formula (a19), $R^{8a}$s each independently represents a hydrogen atom or a group selected from the group consisting of alkyl, hydroxyl, alkoxy, alkylcarbonyl, alkylcarbonyloxy, alkyloxycarbonyl, a halogen atom, an aryl, which may be substituted, and arylcarbonyl. $X^{2a}$ has the same definition as $X^{2a}$ in the above formula (a1).

Specific examples of the sulfonium ion represented by the above formula (a19) include 4-(phenylthio)phenyldiphenylsulfonium, 4-(4-benzoyl-2-chlorophenylthio)phenylbis(4-fluorophenyl)sulfonium, 4-(4-benzoylphenylthio)phenyldiphenylsulfonium, phenyl[4-(4-biphenylthio)phenyl]-4-biphenylsulfonium, phenyl[4-(4-biphenylthio)phenyl]-3-biphenylsulfonium, [4-(4-acetophenylthio)phenyl] diphenylsulfonium, diphenyl[4-(p-terphenylthio)phenyl] diphenylsulfonium, and the like.

In regard to the fluorinated alkylfluorophosphoric acid anion represented by the above formula (a17), $R^{3a}$ represents an alkyl group substituted with a fluorine atom, and a preferred number of carbon atoms is 1 or more and 8 or less, while a more preferred number of carbon atoms is 1 or more and 4 or less. Specific examples of the alkyl group include linear alkyl groups such as methyl, ethyl, propyl, butyl, pentyl, and octyl; branched alkyl groups such as isopropyl, isobutyl, sec-butyl, and tert-butyl; and cycloalkyl groups such as cyclopropyl, cyclobutyl, cyclopentyl, and cyclohexyl. The proportion of hydrogen atoms substituted by fluorine atoms in the alkyl groups is 80% or more, preferably 90% or more, and more preferably 100%. When the substitution rate of fluorine atoms is 80% or more, the acid strength of the onium fluorinated alkylfluorophosphate represented by the above formula (a1) is improved.

A particularly preferred example of $R^{3a}$ is a linear or branched perfluoroalkyl group having 1 or more and 4 or less carbon atoms and a substitution ratio of fluorine atoms of 100%. Specific examples thereof include $CF_3$, $CF_3CF_2$, $(CF_3)_2CF$, $CF_3CF_2CF_2$, $CF_3CF_2CF_2CF_2$, $(CF_3)_2CFCF_2$, $CF_3CF_2(CF_3)CF$, and $(CF_3)_3C$. j which is the number of $R^{3a}$s represents an integer from 1 or more and 5 or less, and is preferably 2 or more and 4 or less, and more preferably 2 or 3.

Preferred specific examples of the fluorinated alkylfluorophosphoric acid anion include $[(CF_3CF_2)_2PF_4]^-$, $[(CF_3CF_2)_3PF_3]^-$, $[((CF_3)_2CF)_2PF_4]^-$, $[((CF_3)_2CF)_3PF_3]^-$, $[(CF_3CF_2CF_2)_2PF_4]^-$, $[(CF_3CF_2CF_2)_3PF_3]^-$, $[((CF_3)_2CFCF_2)_2PF_4]^-$, $[((CF_3)_2CFCF_2)_3PF_3]^-$, $[(CF_3CF_2CF_2CF_2)_2PF_4]^-$, $[(CF_3CF_2CF_2)_3PF_3]^-$, and the like, and $[(CF_3CF_2)_3PF_3]^-$, $[(CF_3CF_2CF_2)_3PF_3]^-$, $[((CF_3)_2CF)_3PF_3]^-$, $[((CF_3)_2CF)_2PF_4]^-$, $[((CF_3)_2CFCF_2)_3PF_3]^-$, and $[((CF_3)_2CFCF_2)_2PF_4]^-$ are preferred.

Preferred specific examples of the borate anion represented by the above formula (a18) include tetrakis(pentafluorophenyl)borate $([B(C_6F_5)_4]^-)$, tetrakis[(trifluoromethyl)phenyl]borate $([B(C_6H_4CF_3)_4]^-)$, difluorobis (pentafluorophenyl)borate ([(C$_6$F$_5$)$_2$BF$_2$]$^-$), trifluoro(pentafluorophenyl)borate ([(C$_6$F$_5$)BF$_3$]$^-$), and tetrakis(difluorophenyl)borate ([B(C$_6$H$_3$F$_2$)$_4$]$^-$). Among these, tetrakis(pentafluorophenyl)borate ([B(C$_6$F$_5$)$_4$]$^-$) is preferred.

The second aspect of the acid generator (A) include halogen-containing triazine compounds such as 2,4-bis(trichloromethyl)-6-piperonyl-1,3,5-triazine, 2,4-bis(trichloromethyl)-6-[2-(2-furyl)ethenyl]-s-triazine, 2,4-bis(trichloromethyl)-6-[2-(5-methyl-2-furyl)ethenyl]-s-triazine, 2,4-bis(trichloromethyl)-6-[2-(5-ethyl-2-furyl)ethenyl]-s-triazine, 2,4-bis(trichloromethyl)-6-[2-(5-propyl-2-furyl)ethenyl]-s-triazine, 2,4-bis(trichloromethyl)-6-[2-(3,5-dimethoxyphenyl)ethenyl]-s-triazine, 2,4-bis(trichloromethyl)-6-[2-(3,5-diethoxyphenyl)ethenyl]-s-triazine, 2,4-bis(trichloromethyl)-6-[2-(3,5-dipropoxyphenyl)ethenyl]-s-triazine, 2,4-bis(trichloromethyl)-6-[2-(3-methoxy-5-ethoxyphenyl)ethenyl]-s-triazine, 2,4-bis(trichloromethyl)-6-[2-(3-methoxy-5-propoxyphenyl)ethenyl]-s-triazine, 2,4-bis(trichloromethyl)-6-[2-(3,4-methylenedioxyphenyl)ethenyl]-s-triazine, 2,4-bis(trichloromethyl)-6-(3,4-methylenedioxyphenyl)-s-triazine, 2,4-bis-trichloromethyl-6-(3-bromo-4-methoxy)phenyl-s-triazine, 2,4-bis-trichloromethyl-6-(2-bromo-4-methoxy)phenyl-s-triazine, 2,4-bis-trichloromethyl-6-(2-bromo-4-methoxy)styrylphenyl-s-triazine, 2,4-bis-trichloromethyl-6-(3-bromo-4-methoxy)styrylphenyl-s-triazine, 2-(4-methoxyphenyl)-4,6-bis(trichloromethyl)-1,3,5-triazine, 2-(4-methoxynaphthyl)-4,6-bis(trichloromethyl)-1,3,5-triazine, 2-[2-(2-furyl)ethenyl]-4,6-bis(trichloromethyl)-1,3,5-triazine, 2-[2-(5-methyl-2-furyl)ethenyl]-4,6-bis(trichloromethyl)-1,3,5-triazine, 2-[2-(3,5-dimethoxyphenyl)ethenyl]-4,6-bis(trichloromethyl)-1,3,5-triazine, 2-[2-(3,4-dimethoxyphenyl)ethenyl]-4,6-bis(trichloromethyl)-1,3,5-triazine, 2-(3,4-methylenedioxyphenyl)-4,6-bis(trichloromethyl)-1,3,5-triazine, tris(1,3-dibromopropyl)-1,3,5-triazine, and tris(2,3-dibromopropyl)-1,3,5-triazine, along with halogen-containing triazine compounds represented by the following formula (a3) such as tris(2,3-dibromopropyl)isocyanurate.

[Chem. 7]

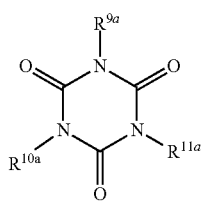

(a3)

In the above formula (a3), $R^{9a}$ to $R^{11a}$ each independently represent a halogenated alkyl group.

The third aspect of the acid generator (A) include α-(p-toluenesulfonyloxyimino)-phenylacetonitrile, α-(benzenesulfonyloxyimino)-2,4-dichlorophenylacetonitrile, α-(benzenesulfonyloxyimino)-2,6-dichlorophenylacetonitrile, α-(2-chlorobenzenesulfonyloxyimino)-4-methoxyphenylacetonitrile, and α-(ethylsulfonyloxyimino)-1-cyclopentenylacetonitrile, along with compounds represented by the following formula (a4) containing an oximesulfonate group.

[Chem. 8]

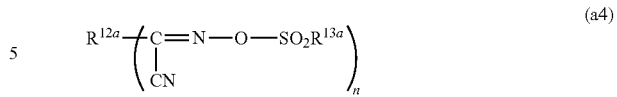

(a4)

In the above formula (a4), $R^{12a}$ represents a monovalent, bivalent or trivalent organic group, $R^{13a}$ represents a substituted or unsubstituted saturated hydrocarbon group, an unsaturated hydrocarbon group, or an aromatic compound group, and n represents the number of repeating units of the structure in the parentheses.

In the above formula (a4), the aromatic compound group indicates a group of compounds having physical and chemical properties characteristic of aromatic compounds, and examples thereof include aryl groups such as a phenyl group and a naphthyl group, and heteroaryl groups such as a furyl group and a thienyl group. These groups may have one or more substituents such as halogen atoms, alkyl groups, alkoxy groups and nitro groups on the rings. Furthermore, $R^{13a}$ is an alkyl group having 1 or more and 6 or less carbon atoms such as a methyl group, an ethyl group, a propyl group, and a butyl group. In particular, compounds in which $R^{12a}$ is an aromatic compound group, and $R^{13a}$ is an alkyl group having 1 or more and 4 or less carbon atoms are preferred.

Examples of the acid generator represented by the above formula (a4) include compounds in which $R^{12a}$ is any one of a phenyl group, a methylphenyl group, and a methoxyphenyl group, and $R^{13a}$ is a methyl group, provided that n is 1, and specific examples thereof include α-(methylsulfonyloxyimino)-1-phenylacetonitrile, α-(methylsulfonyloxyimino)-1-(p-methylphenyl)acetonitrile, α-(methylsulfonyloxyimino)-1-(p-methoxyphenyl)acetonitrile, [2-(propylsulfonyloxyimino)-2,3-dihydroxythiophene-3-ylidene] (o-tolyl) acetonitrile, and the like. When n is 2, the acid generator represented by the above formula (a4) is an acid generator represented by the following formulae.

[Chem. 9]

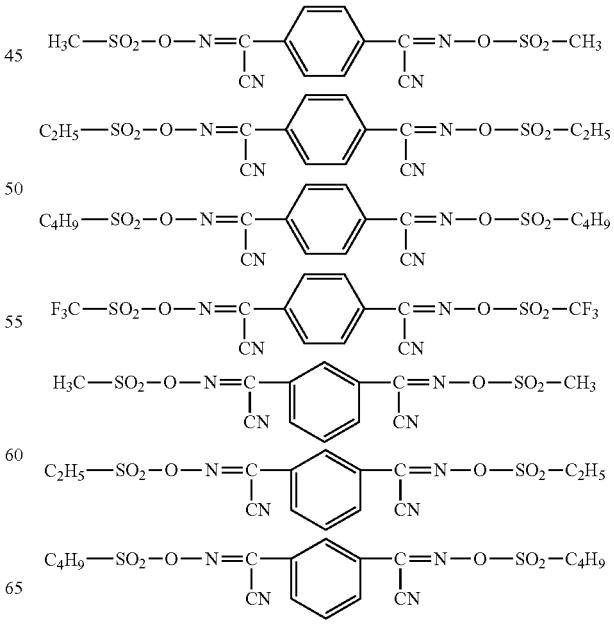

-continued

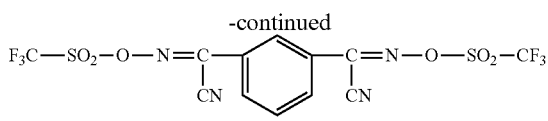

In addition, the fourth aspect of the acid generator (A) includes onium salts that have a naphthalene ring at their cation moiety. The expression "have a naphthalene ring" indicates having a structure derived from naphthalene and also indicates at least two ring structures and their aromatic properties are maintained. The naphthalene ring may have a substituent such as a linear or branched alkyl group having 1 or more and 6 or less carbon atoms, a hydroxyl group, and a linear or branched alkoxy group having 1 or more and 6 or less carbon atoms or the like. The structure derived from the naphthalene ring, which may be of a monovalent group (one free valence) or of a bivalent group (two free valences), is desirably of a monovalent group (in this regard, the number of free valences is counted except for the portions connecting with the substituents described above). The number of naphthalene rings is preferably 1 or more and 3 or less.

Preferably, the cation moiety of the onium salt having a naphthalene ring at the cation moiety is of the structure represented by the following formula (a5).

[Chem. 10]

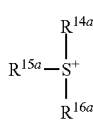

(a5)

In the above formula (a5), at least one of $R^{14a}$ to $R^{16a}$ represents a group represented by the following formula (a6), and the remaining represents a linear or branched alkyl group having 1 or more and 6 or less carbon atoms, a phenyl group which may have a substituent, a hydroxyl group, or a linear or branched alkoxy group having 1 or more and 6 or less carbon atoms. Alternatively, one of $R^{14a}$ to $R^{16a}$ is a group represented by the following formula (a6), and the remaining two are each independently a linear or branched alkylene group having 1 or more and 6 or less carbon atoms, and these terminals may bond to form a ring structure.

[Chem. 11]

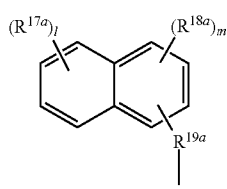

(a6)

In the above formula (a6), $R^{17a}$ and $R^{18a}$ each independently represent a hydroxyl group, a linear or branched alkoxy group having 1 or more and 6 or less carbon atoms, or a linear or branched alkyl group having 1 or more and 6 or less carbon atoms, and $R^{19a}$ represents a single bond or a linear or branched alkylene group having 1 or more and 6 or less carbon atoms that may have a substituent. l and m each independently represent an integer of 0 or more and 2 or less, and l+m is 3 or less. In this regard, when there exists a plurality of $R^{17a}$, they may be identical or different from each other. Furthermore, when there exists a plurality of $R^{10a}$, they may be identical or different from each other.

Preferably, among $R^{14a}$ to $R^{16a}$ as above, the number of groups represented by the above formula (a6) is one in view of the stability of the compound, and the remaining are linear or branched alkylene groups having 1 or more and 6 or less carbon atoms of which the terminals may bond to form a ring. In this case, the two alkylene groups described above form a 3- to 9-membered ring including sulfur atom(s). Preferably, the number of atoms to form the ring (including sulfur atom(s)) is 5 or more and 6 or less.

The substituent, which the alkylene group may have, is exemplified by an oxygen atom (in this case, a carbonyl group is formed together with a carbon atom that constitutes the alkylene group), a hydroxyl group or the like.

Alternatively, the substituent, which the phenyl group may have, is exemplified by a hydroxyl group, a linear or branched alkoxy groups having 1 or more and 6 or less carbon atoms, linear or branched alkyl groups having 1 or more and 6 or less carbon atoms, or the like.

Examples of suitable cation moiety include those represented by the following formulae (a7) or (a8), and the structure represented by the following formula (a8) is preferable.

[Chem. 12]

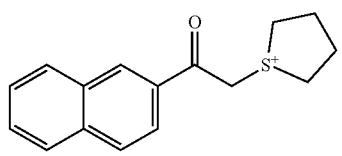

(a7)

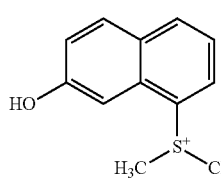

(a8)

The cation moieties, which may be of an iodonium salt or a sulfonium salt, are desirably of a sulfonium salt in view of acid-producing efficiency.

Therefore, preferable examples of the anion moiety of the onium salt having a naphthalene ring at the cation moiety include an anion capable of forming a sulfonium salt. Specific examples thereof include fluoroalkylsulfonic acid ions, of which hydrogen atom(s) being partially or entirely fluorinated, or aryl sulfonic acid ions.

The alkyl group of the fluoroalkylsulfonic acid ions may be linear, branched or cyclic and have 1 or more and 20 or less carbon atoms. Preferably, the number of carbon atoms is 1 or more and 10 or less in view of bulkiness and diffusion distance of the produced acid. In particular, branched or cyclic groups are preferable due to shorter diffusion length. Also, methyl, ethyl, propyl, butyl, octyl groups and the like are preferable due to being inexpensively synthesizable.

The aryl group of the aryl sulfonic acid ions may be an aryl group having 6 or more and 20 or less carbon atoms, and specifically, is exemplified by a phenol group or a naphthyl group that may be substituted with an alkyl group or a halogen atom. In particular, aryl groups having 6 or more and 10 or less carbon atoms are preferred since they can be synthesized inexpensively. Specific examples thereof include phenyl, toluenesulfonyl, ethylphenyl, naphthyl, methylnaphthyl groups and the like.

When hydrogen atoms in the fluoroalkylsulfonic acid ion or the aryl sulfonic acid ion are partially or entirely substituted with a fluorine atom, the fluorination rate is preferably 10% or more and 100% or less, and more preferably 50% or more and 100% or less. It is particularly preferable that all hydrogen atoms are each substituted with a fluorine atom in view of higher acid strength. Specific examples thereof include trifluoromethane sulfonate, perfluorobutane sulfonate, perfluorooctane sulfonate, perfluorobenzene sulfonate, and the like.

Among these, the preferable anion moiety is exemplified by those represented by the following formula (a9).

[Chem. 13]

$R^{20a}SO_3^-$ (a9)

In the above formula (a9), $R^{20a}$ is a group represented by the following formulae (a10), (a11), or (a12).

[Chem. 14]

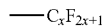

—$C_xF_{2x+1}$ (a10)

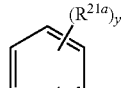

(a11)

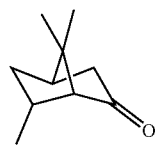

(a12)

In the above formula (a10), x represents an integer of 1 or more and 4 or less. Also, in the above formula (a11), $R^{21a}$ represents a hydrogen atom, a hydroxyl group, a linear or branched alkyl group having 1 or more and 6 or less carbon atoms, or a linear or branched alkoxy group having 1 or more and 6 or less carbon atoms, and y represents an integer of 1 or more and 3 or less. Among these, trifluoromethane sulfonate and perfluorobutane sulfonate are preferable in view of safety.

In addition, a nitrogen-containing moiety represented by the following formulae (a13) or (a14) may be also be used for the anion moiety.

[Chem. 15]

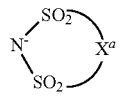

(a13)

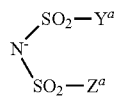

(a14)

In the above formulae (a13) and (a14), $X^a$ represents a linear or branched alkylene group in which at least one hydrogen atom is substituted with a fluorine atom, the carbon number of the alkylene group is 2 or more and 6 or less, preferably 3 or more and 5 or less, and more preferably the carbon number is 3. In addition, $Y^a$ and $Z^a$ each independently represent a linear or branched alkyl group in which at least one hydrogen atom is substituted with a fluorine atom, the number of carbon atoms of the alkyl group is 1 or more and 10 or less, preferably 1 or more and 7 or less, and more preferably 1 or more and 3 or less.

A smaller number of carbon atoms in the alkylene group of $X^a$ or in the alkyl group of $Y^a$ or $Z^a$ is preferred since the solubility into an organic solvent is favorable.

In addition, a larger number of hydrogen atoms each substituted by a fluorine atom in the alkylene group of $X^a$ or in the alkyl group of $Y^a$ or $Z^a$ is preferred since the acid strength becomes greater. The percentage of fluorine atoms in the alkylene group or alkyl group, i.e., the fluorination rate, is preferably 70% or more and 100% or less, more preferably 90% or more and 100% or less, and further more preferably are perfluoroalkylene or perfluoroalkyl groups in which all of the hydrogen atoms are each substituted with a fluorine atom.

Preferable onium salts having a naphthalene ring at their cation moieties are exemplified by compounds represented by the following formulae (a15) or (a16).

[Chem. 16]

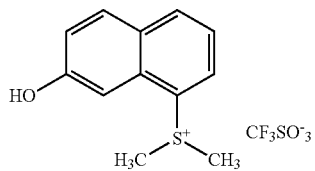

(a15)

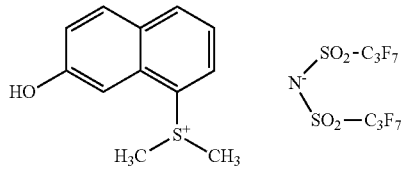

(a16)

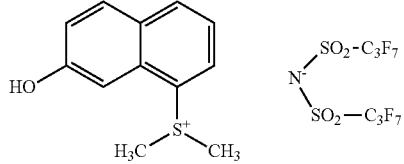

The fifth aspect of the acid generator (A) include bis-sulfonyldiazomethanes such as bis(p-toluenesulfonyl)diazomethane, bis(1,1-dimethyl ethylsulfonyl)diazomethane, bis(cyclohexylsulfonyl)diazomethane and bis(2,4-dimethylphenylsulfonyl)diazomethane; nitrobenzyl derivatives such as 2-nitrobenzyl p-toluenesulfonate, 2,6-dinitrobenzyl p-toluenesulfonate, nitrobenzyl tosylate, dinitrobenzyl tosylate, nitrobenzyl sulfonate, nitrobenzyl carbonate and dinitrobenzyl carbonate; sulfonates such as pyrogalloltrimesylate, pyrogalloltritosylate, benzyltosylate, benzylsulfonate, N-(methylsulfonyloxy) succinimide, N-(trichloromethylsulfonyloxy)succinimide, N-(phenylsulfonyloxy)maleimide, and N-(methylsulfonyloxy) phthalimide; trifluoromethane sulfonates such as N-(trifluoromethylsulfonyloxy)phthalimide, N-(trifluoromethylsulfonyloxy)-1,8-naphthalimide, N-(trifluoromethylsulfonyloxy)-4-butyl-1,8-naphthalimide N-hydroxyphthalimide and N-hydroxynaphthalimide; onium salts such as diphenyliodonium hexafluorophosphate, (4-methoxyphenyl)phenyliodonium trifluoromethanesulfonate, bis(p-tert-butylphenyl)iodonium trifluoromethanesulfonate, triphenylsulfonium hexafluorophosphate, (4-methoxyphenyl)diphenylsulfonium trifluoromethanesulfonate, and (p-tert-butylphenyl)diphenylsulfonium trifluoromethanesulfonate; benzointosylates such as benzointosylate and α-methylbenzointosylate; other diphenyliodonium salts, triphenylsulfonium salts, phenyldiazonium salts, benzylcarbonates; and the like.

These acid generators (A) may be used alone, or two or more kinds may be used in combination.

The content of the acid generator (A) is preferably 0.1% by mass or more and 10% by mass or less, and more preferably 0.5% by mass or more and 3% by mass or less, relative to the total mass of the photosensitive resin composition.

<Resin (B)>

The resin (B) whose alkali solubility increases by the action of an acid is not particularly limited, and an arbitrary resin whose alkali solubility increases by the action of an acid may be used. Among these, at least one resin selected from the group consisting of novolak resin (B1), polyhydroxystyrene resins (B2), and acrylic resin (B3) is preferably contained, and acrylic resin (B3) is more preferably contained.

[Novolak resin (B1)]

As the novolak resin (B1), a resin including the structural unit represented by the following formula (b1) may be used.

[Chem. 17]

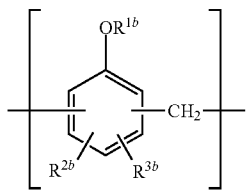

(b1)

In the above formula (b1), $R^{1b}$ represents an acid-dissociable dissolution-inhibiting group, and $R^{2b}$ and $R^{3b}$ each independently represent a hydrogen atom or an alkyl group having 1 or more and 6 or less carbon atoms.

The acid-dissociable dissolution-inhibiting group represented by the above $R^{1b}$ is preferably a group represented by the following formulae (b2) or (b3), a linear, branched or cyclic alkyl group having 1 or more and 6 or less carbon atoms, a vinyloxyethyl group, a tetrahydropyranyl group, a tetrafuranyl group, or a trialkylsilyl group.

[Chem. 18]

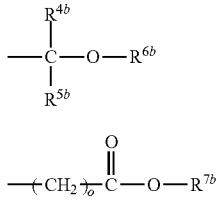

(b2)

(b3)

In the formulae (b2) and (b3), $R^{4b}$ and $R^{5b}$ each independently represent a hydrogen atom or a linear or branched alkyl group having 1 or more and 6 or less carbon atoms, $R^{6b}$ represents a linear, branched, or cyclic alkyl group having 1 or more and 10 or less carbon atoms, $R^{7b}$ represents a linear, branched, or cyclic alkyl group having 1 or more and 6 or less carbon atoms, and o represents 0 or 1.

Examples of the linear or branched alkyl group include a methyl group, an ethyl group, a propyl group, an isopropyl group, an n-butyl group, an isobutyl group, a tert-butyl group, a pentyl group, an isopentyl group, a neopentyl group, and the like. Also, examples of the cyclic alkyl group include a cyclopentyl group, a cyclohexyl group, and the like.

Specific examples of the acid-dissociable dissolution-inhibiting group represented by the above formula (b2) include a methoxyethyl group, an ethoxyethyl group, an n-propoxyethyl group, an isopropoxyethyl group, an n-butoxyethyl group, an isobutoxyethyl group, a tert-butoxyethyl group, a cyclohexyloxyethyl group, a methoxypropyl group, an ethoxypropyl group, a 1-methoxy-1-methyl-ethyl group, a 1-ethoxy-1-methylethyl group, and the like. Furthermore, specific examples of the acid-dissociable dissolution-inhibiting group represented by the above formula (b3) include a tert-butoxycarbonyl group, tert-butoxycarbonylmethyl group, and the like. Examples of the trialkylsilyl group include a trimethylsilyl group and tri-tert-butyldimethylsilyl group in which each alkyl group has 1 or more and 6 or less carbon atoms.

[Polyhydroxystyrene Resin (B2)]

As the polyhydroxystyrene resin (B2), a resin including the structural unit represented by the following formula (b4) may be used.

[Chem. 19]

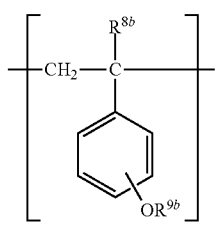

(b4)

In the formula (b4), $R^{8b}$ represents a hydrogen atom or an alkyl group having 1 or more and 6 or less carbon atoms, and $R^{9b}$ represents an acid-dissociable dissolution-inhibiting group.

The alkyl group having 1 or more and 6 or less carbon atoms may include, for example, linear, branched or cyclic alkyl groups having 1 or more and 6 or less carbon atoms. Examples of the linear or branched alkyl group include a methyl group, ethyl group, a propyl group, an isopropyl group, an n-butyl group, isobutyl group, a tert-butyl group, a pentyl group, an isopentyl group, and a neopentyl group, and examples of the cyclic alkyl group include a cyclopentyl group and a cyclohexyl group.

The acid-dissociable dissolution-inhibiting group represented by the above $R^{9b}$ may be similar to the acid-dissociable dissolution-inhibiting groups exemplified in terms of the above formulae (b2) and (b3).

Furthermore, the polyhydroxystyrene resin (B2) may include another polymerizable compound as a structural unit in order to moderately control physical or chemical properties. The polymerizable compound is exemplified by conventional radical polymerizable compounds and anion polymerizable compounds. Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth)acrylic acid alkyl esters such as methyl (meth)acrylate, ethyl (meth)acrylate, and butyl (meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; and amide bond-containing polymerizable compounds such as acrylamide and methacrylamide; and the like.

[Acrylic Resin (B3)]

As the acrylic resin (B3), a resin including a structural unit represented by the following formulae (b5) to (b7) may be used.

[Chem. 20]

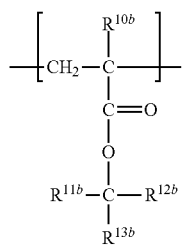

(b5)

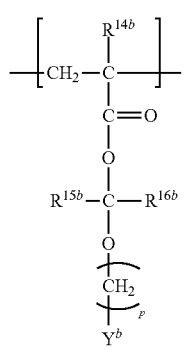

(b6)

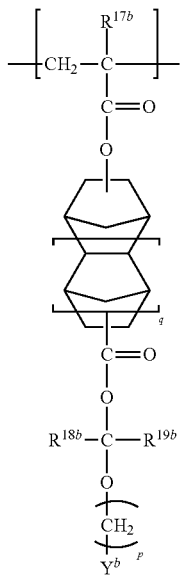

(b7)

$R^{13b}$ and $R^{14b}$ to $R^{19b}$ in the above formulae (b5) to (b7) are each independently a hydrogen atom, a linear or branched alkyl group having 1 or more and 6 or less carbon atoms, a fluorine atom, or a linear or branched fluorinated alkyl group having 1 or more and 6 or less carbon atoms. $R^{11b}$ to $R^{13b}$ are each independently a linear or branched alkyl group having 1 or more and 6 or less carbon atoms, a linear or branched fluorinated alkyl group having 1 or more and 6 or less carbon atoms or an aliphatic cyclic group having 5 or more and 20 or less carbon atoms. $R^{12b}$ and $R^{13b}$ may join each other to form a hydrocarbon ring having 5 or more and 20 or less carbon atoms together with a carbon atom to which both are attached. $Y^b$ represents an aliphatic cyclic group or an alkyl group optionally having a substituent. p is an integer of 0 or more and 4 or less, and q is 0 or 1.

Examples of the linear or branched alkyl group include a methyl group, ethyl group, propyl group, isopropyl group, n-butyl group, isobutyl group, tert-butyl group, pentyl group, isopentyl group, neopentyl group, and the like. The fluorinated alkyl group refers to the abovementioned alkyl groups of which the hydrogen atoms are partially or entirely substituted with fluorine atoms. Specific examples of the aliphatic cyclic group include a group in which one or more hydrogen atoms are removed from monocycloalkanes and polycycloalkanes such as bicycloalkanes, tricycloalkanes, and tetracycloalkanes. Specific examples thereof include a group in which one hydrogen atom is removed from monocycloalkanes such as cyclopentane, cyclohexane, cycloheptane, and cyclooctane, and polycycloalkanes such as adamantane, norbornane, isobornane, tricyclodecane, and tetracyclododecane. In particular, cyclohexane and adamantane from which one hydrogen atom is removed (optionally further having a substituent) are preferable.

In a case where $R^{12b}$ and $R^{13b}$ do not form a hydrocarbon ring by joining each other, a linear or branched alkyl group having 2 or more and 4 or less carbon atoms is preferred as $R^{11b}$, $R^{12b}$, and $R^{13b}$ in view of high contrast, good resolution, good focal depth-width and the like. As $R^{15b}$, $R^{16b}$, $R^{18b}$ and $R^{19b}$, preferred is a hydrogen atom or a methyl group.

$R^{12b}$ and $R^{13b}$ may form an aliphatic cyclic group having 5 or more and 20 or less carbon atoms together with a carbon atom to which both are attached. Specific examples of such an aliphatic cyclic group include a group in which one or more hydrogen atoms are removed from monocycloalkane and polycycloalkane such as bicycloalkane, tricycloalkane, and tetracycloalkane. Specifically, they include a group in which one or more hydrogen atoms are removed from monocycloalkane such as cyclopentane, cyclohexane, and cycloheptane; and polycycloalkane such as adamantane, norbornane, isobornane, tricyclodecane and tetracyclododecane; and the like. In particular, cyclohexane and adamantane from which one or more hydrogen atoms are removed (optionally further having a substituent) are preferable.

Further, in a case where an aliphatic cyclic group to be formed with $R^{12b}$ and $R^{13b}$ has a substituent on the ring backbone thereof, examples of the substituent include a polar group such as a hydroxyl group, a carboxyl group, a cyano group and an oxygen atom (=O), and a linear or branched alkyl group having 1 or more and 4 or less carbon atoms. As the polar group, an oxygen atom (=O) is particularly preferred.

$Y^b$ is an alicyclic group or an alkyl group; and examples thereof are monocycloalkanes and polycycloalkanes such as bicycloalkanes, tricycloalkanes, and tetracycloalkanes from which at least one hydrogen atom is removed. Specific examples thereof are monocycloalkanes such as cyclopentane, cyclohexane, cycloheptane, and cyclooctane, and polycycloalkanes such as adamantane, norbornane, isobornane, tricyclodecane, and tetracyclododecane, from which at least one hydrogen atom is removed. Particularly preferable is adamantane from which at least one hydrogen atom is removed (that may further have a substituent).

In addition, when the alicyclic group of $Y^b$ has a substituent on the ring skeleton, the substituent is exemplified by polar groups such as a hydroxide group, a carboxyl group, a cyano group, and an oxygen atom (=O) and linear or branched lower alkyl groups having 1 or more and 4 or less carbon atoms. The polar group is preferably an oxygen atom (=O) in particular.

Furthermore, when $Y^b$ is an alkyl group, it is preferably a linear or branched alkyl group having 1 or more and 20 or less carbon atoms, and more preferably 6 or more and 15 or less carbon atoms. Preferably, the alkyl group is an alkoxyalkyl group in particular, and examples of the alkoxyalkyl group include a 1-methoxyethyl group, 1-ethoxyethyl group, 1-n-propoxyethyl group, 1-isopropoxyethyl group, 1-n-butoxyethyl group, 1-isobutoxyethyl group, 1-tert-butoxyethyl group, 1-methoxypropyl group, 1-ethoxypropyl group, 1-methoxy-1-methylethyl group, 1-ethoxy-1-methylethyl group, and the like.

Preferable specific examples of the structural unit represented by the above formula (b5) are those represented by the following formulae (b5-1) to (b5-33).

[Chem. 21]

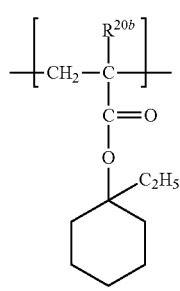
(b5-1)

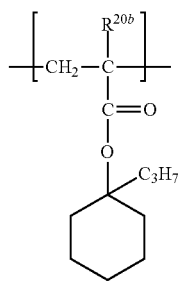
(b5-2)

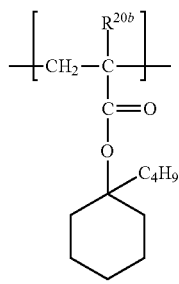
(b5-3)

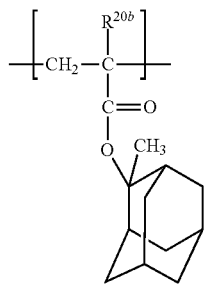
(b5-4)

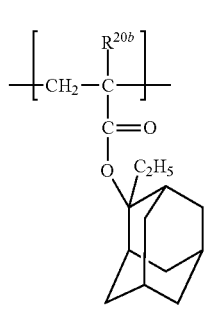
(b5-5)

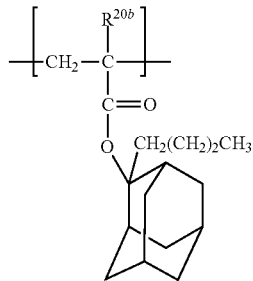
(b5-6)

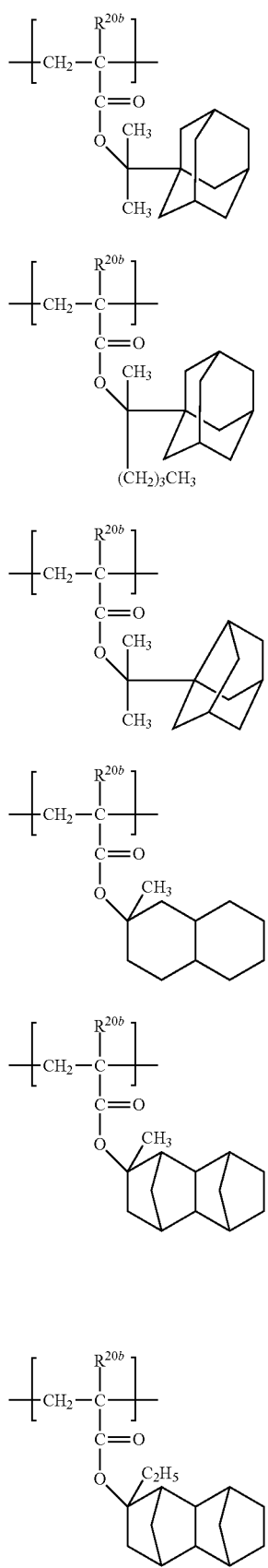
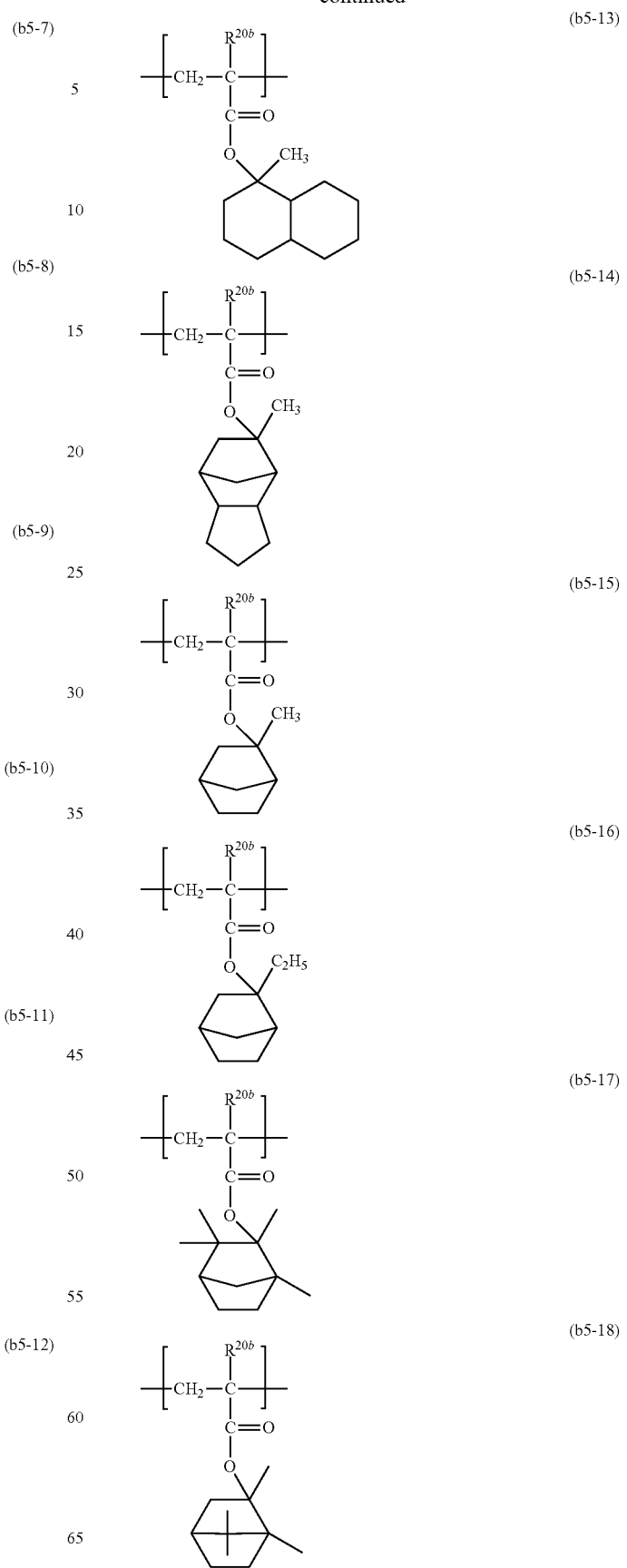

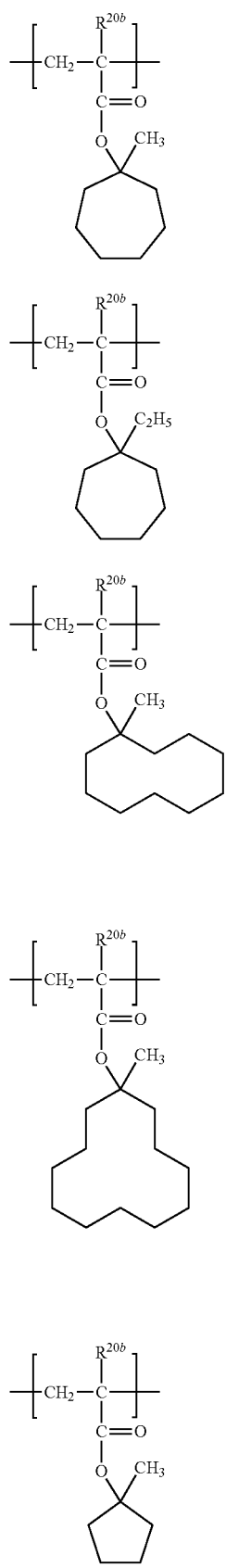
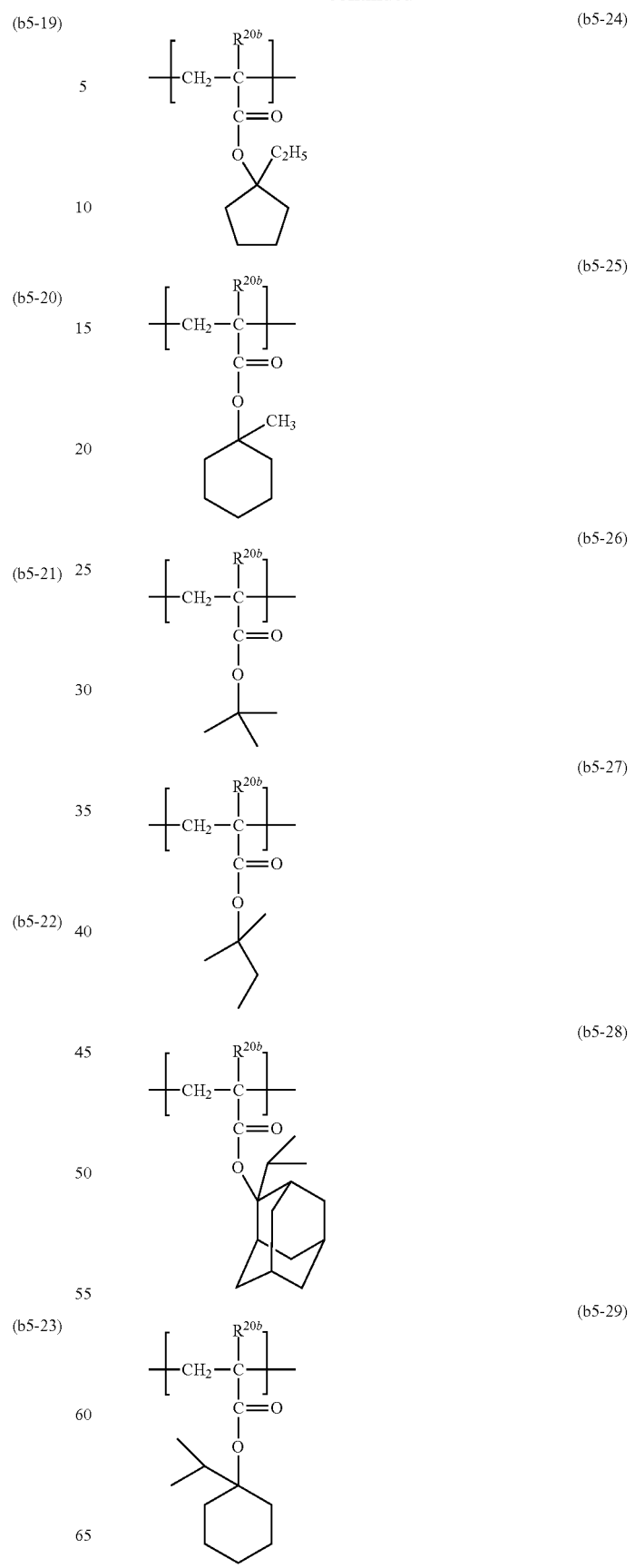

(b5-30)
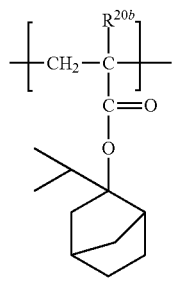
(b5-31)
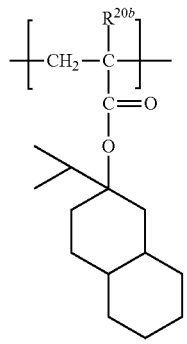
(b5-32)
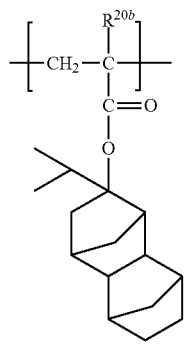
(b5-33)
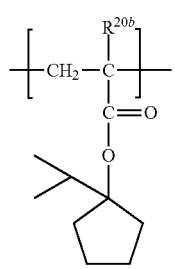
[Chem. 22]
(b6-1)
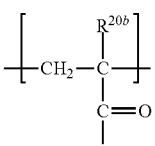
(b6-2)
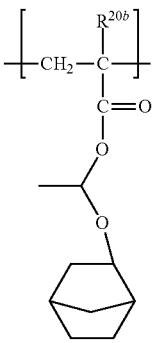
(b6-3)
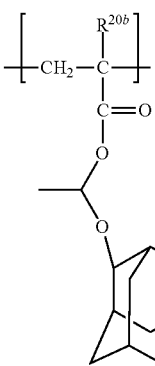
(b6-4)
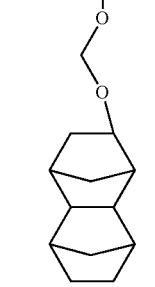
In the above formulae (b5-1) to (b5-33), $R^{20b}$ represents a hydrogen atom or a methyl group.
Preferable specific examples of the structural unit represented by the above formula (b6) include those represented by the following formulae (b6-1) to (b6-25).

(b6-5)
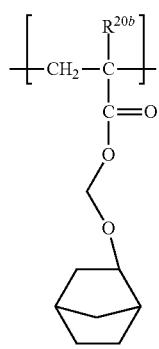
(b6-6)
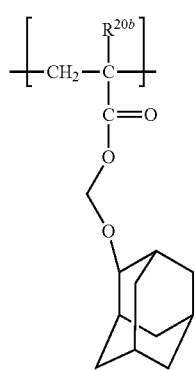
(b6-7)
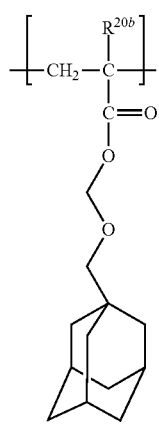
(b6-8)
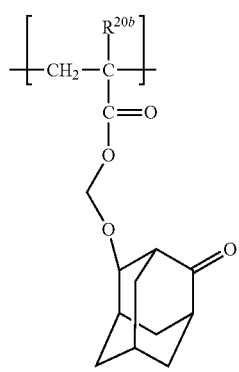
(b6-9)
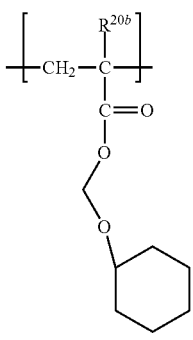
(b6-10)
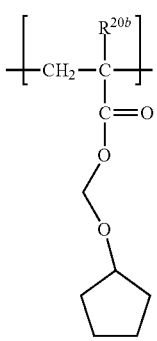
(b6-11)
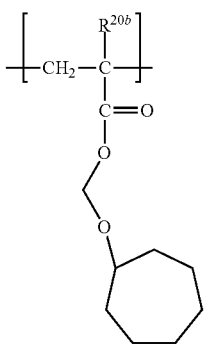
(b6-12)
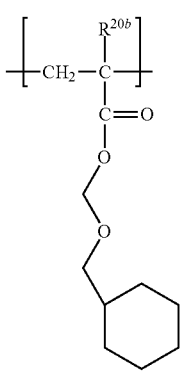

-continued
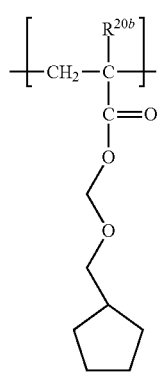
(b6-13)
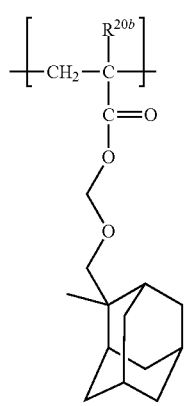
(b6-14)
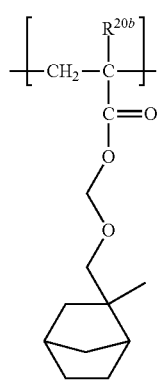
(b6-15)
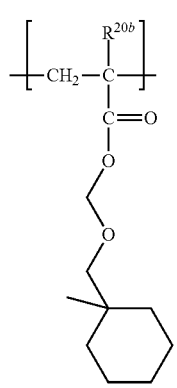
(b6-16)
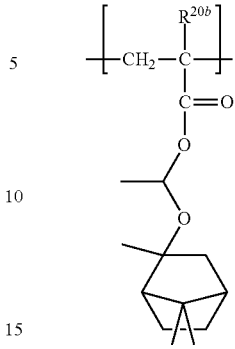
(b6-17)
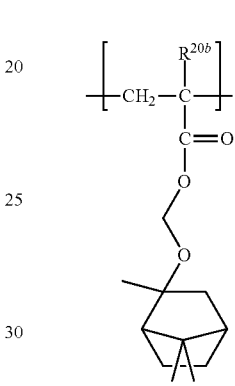
(b6-18)
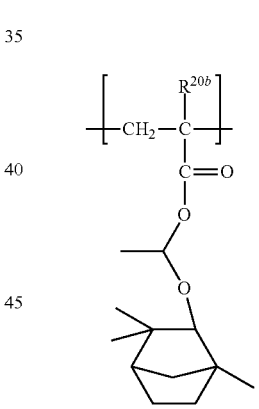
(b6-19)
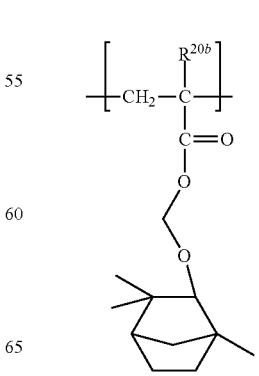
(b6-20)

-continued
(b6-21)
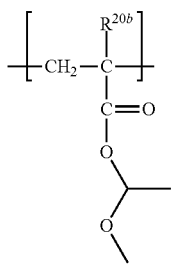
(b6-22)
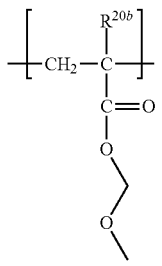
(b6-23)
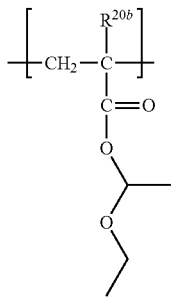
(b6-24)
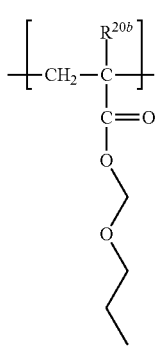
(b6-25)
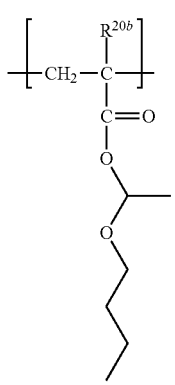
In the above formulae (b6-1) to (b6-25), $R^{20b}$ presents a hydrogen atom or a methyl group.
Preferable specific examples of the structural unit represented by the above formula (b7) include those represented by the following formulae (b7-1) to (b7-15).
[Chem. 23]
(b7-1)
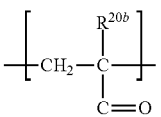
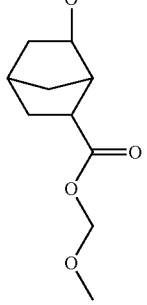
(b7-2)
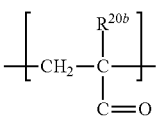
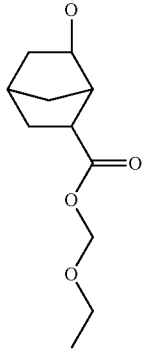
(b7-3)
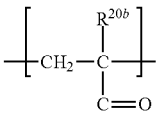
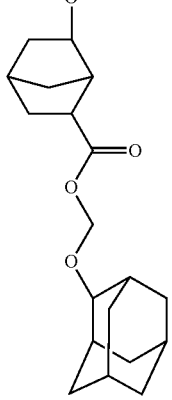

(b7-4)
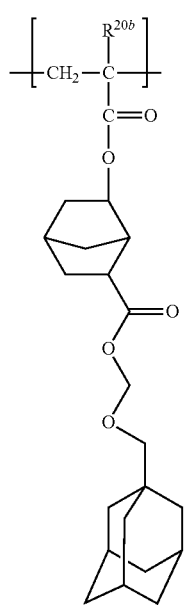
(b7-6)
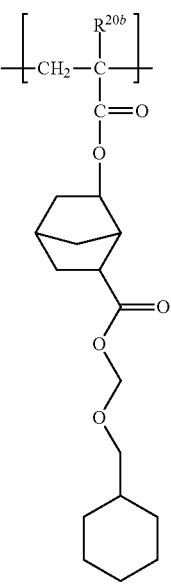
(b7-5)
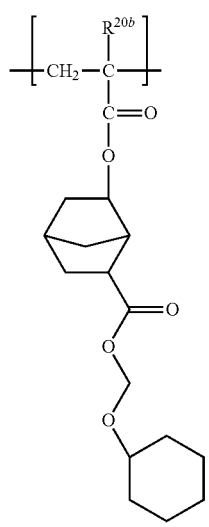
(b7-7)
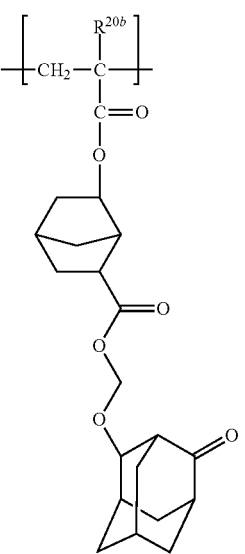

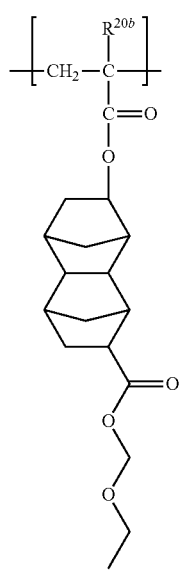
(b7-8)
(b7-9)
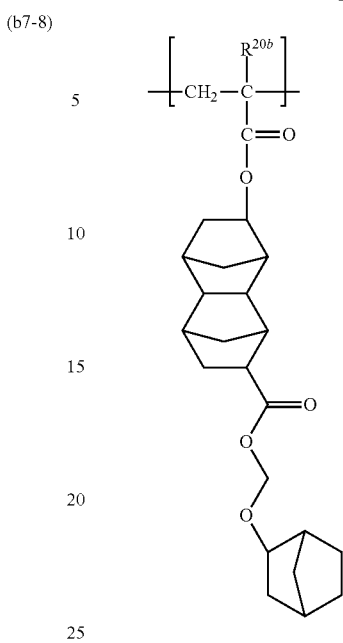
(b7-10)
(b7-11)

(b7-12)
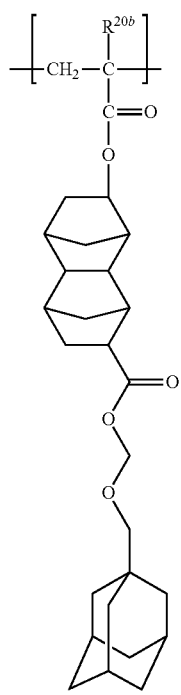
(b7-13)
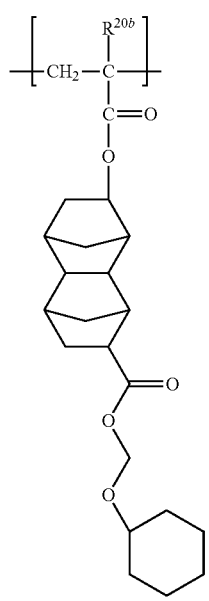
(b7-14)
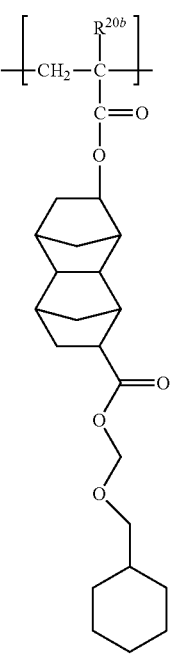
(b7-15)
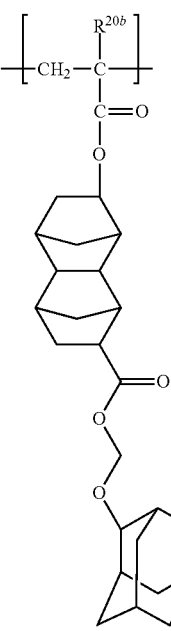

In the above formula (b7-1) to (b7-15), $R^{20b}$ resents a hydrogen atom or a methyl group.

It is also preferred that the acrylic resin (B3) includes a copolymer including a structural unit derived from a polymerizable compound having an ether bond in addition to the structural unit represented by the above formulae (b5) to (b7).

Illustrative examples of the polymerizable compound having an ether linkage include radical polymerizable compounds such as (meth)acrylic acid derivatives having an ether linkage and an ester linkage. Specific examples thereof include 2-methoxyethyl (meth)acrylate, 2-ethoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolyethylene glycol (meth)acrylate, methoxypolypropylene glycol (meth)acrylate, tetrahydrofurfuryl (meth)acrylate, and the like. Also, the polymerizable compound having an ether linkage is preferably 2-methoxyethyl (meth)acrylate, 2-ethoxyethyl (meth)acrylate, or methoxytriethylene glycol (meth)acrylate. These polymerizable compounds may be used alone or in combinations of two or more thereof.

Furthermore, the acrylic resin (B3) may include another polymerizable compound as a structural unit in order to moderately control physical and chemical properties. The polymerizable compound is exemplified by conventional radical polymerizable compounds and anion polymerizable compounds.

Examples of the polymerizable compound include monocarboxylic acids such as acrylic acid, methacrylic acid, and crotonic acid; dicarboxylic acids such as maleic acid, fumaric acid, and itaconic acid; methacrylic acid derivatives having a carboxyl group and an ester bond such as 2-methacryloyloxyethyl succinic acid, 2-methacryloyloxyethyl maleic acid, 2-methacryloyloxyethyl phthalic acid, and 2-methacryloyloxyethyl hexahydrophthalic acid; (meth)acrylic acid alkyl esters such as methyl(meth)acrylate, ethyl (meth)acrylate, butyl(meth)acrylate, and cyclohexyl(meth)acrylate; (meth)acrylic acid hydroxyalkyl esters such as 2-hydroxyethyl (meth)acrylate and 2-hydroxypropyl (meth)acrylate; (meth)acrylic acid aryl esters such as phenyl (meth)acrylate and benzyl (meth)acrylate; dicarboxylic acid diesters such as diethyl maleate and dibutyl fumarate; vinyl group-containing aromatic compounds such as styrene, α-methylstyrene, chlorostyrene, chloromethylstyrene, vinyltoluene, hydroxystyrene, α-methylhydroxystyrene, and α-ethylhydroxystyrene; vinyl group-containing aliphatic compounds such as vinyl acetate; conjugated diolefins such as butadiene and isoprene; nitrile group-containing polymerizable compounds such as acrylonitrile and methacrylonitrile; chlorine-containing polymerizable compounds such as vinyl chloride and vinylidene chloride; amide bond-containing polymerizable compounds such as acrylamide and methacrylamide; and the like.

Furthermore, examples of the polymerizable compound include (meth)acrylic acid esters having a non-acid-dissociable aliphatic polycyclic group and vinyl group-containing aromatic compounds. As the non-acid-dissociable aliphatic polycyclic group, in particular, a tricyclodecanyl group, an adamantyl group, a tetracyclododecanyl group, an isobornyl group, a norbornyl group, and the like are preferred from the viewpoint of easy industrial availability. These aliphatic polycyclic groups may have a linear or branched alkyl group having 1 or more and 5 or less carbon atoms as a substituent.

Specific examples of the (meth)acrylic acid esters having a non-acid-dissociable aliphatic polycyclic group include compounds having structures represented by the following formulae (b8-1) to (b8-5).

[Chem. 24]

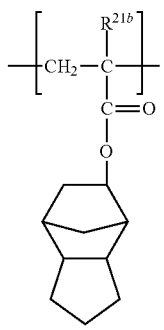

(b8-1)

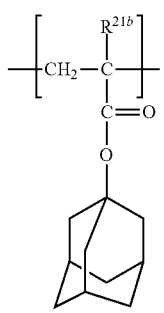

(b8-2)

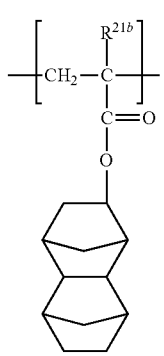

(b8-3)

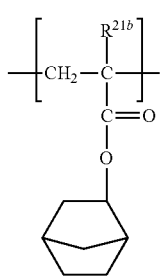

(b8-4)

(b8-5)

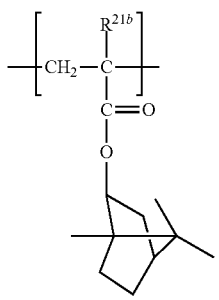

In formulae (b8-1) to (b8-5), $R^{21b}$ represents a hydrogen atom or a methyl group. These resins (B) may be used alone, or two or more kinds may be used in combination.

The polystyrene equivalent mass average molecular weight of the resin (B) is preferably 10,000 or more and 600,000 or less, more preferably 20,000 or more and 400,000 or less, and further more preferably 30,000 or more and 300,000 or less. By thus adjusting the mass average molecular weight, the photosensitive resin layer can maintain sufficient strength without deteriorating peel properties with supports, and also swelling of profiles in plating, and generation of cracks can be prevented.

It is also preferred that the resin (B) has a dispersivity of 1.05 or more. A dispersivity herein indicates a value of a mass average molecular weight divided by a number average molecular weight. A dispersivity in the range described above improves stress resistance on plating and can avoid a problem of swelling of metal layers resulting from the plating process easily occurring. Furthermore, the upper limit of the dispersivity of the resin (B) is not particularly limited, but it is, for example, 4.5 or less. Note here that the resin (B) may be used by combining a plurality of kinds of the components described above. In this case, the mass average molecular weight and the number average molecular weight are measured in a state in which each component is included, and the dispersivity can be calculated.

The content of the resin (B) is preferably 5% by mass or more and 60% by mass or less, and more preferably 10% by mass or more and 40% by mass or less with respect to the total mass of the photosensitive resin composition.

<Sulfur-Containing Compound (C)>

The sulfur-containing compound (C) includes a sulfur-containing compound (C1) represented by the specific formula and a thiol compound (C2) that is different from the sulfur-containing compound (C1). When the photosensitive resin composition contains the sulfur-containing compound (C1) and the thiol compound (C2), even when a resist pattern is formed on a metal surface, a resist pattern having excellent cross-sectional perpendicularity of a nonresist section can be formed.

[Sulfur-Containing Compound (C1)]

The sulfur-containing compound (C1) is a compound represented by at least one of the following formulae (c1-1) and (c1-2).

[Chem. 25]

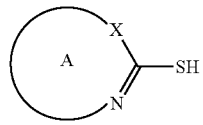

(c1-1)

(c1-2)

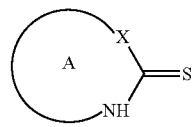

In the above formulae (c1-1) and (c1-2), a ring A is a monocyclic ring having 4 or more and 8 or less ring-forming atoms, or a polycyclic ring having 5 or more and 20 or less ring-forming atoms, X is $-CR^{1c}R^{2c}-$, $-NR^{3c}-$, $-O-$, $-S-$, $-Se-$, $-Te-$, $=CR^{4c}-$, or $=N-$, and $R^{1c}$, $R^{2c}$, $R^{1c}$, and $R^{4c}$ each independently represents a hydrogen atom, a halogen atom, a nitro group, a cyano group, or an organic group. However, the compound represented by the formula (c1-1) has one mercapto group in a molecule, and does not have a hydroxyl group. The compound represented by the formula (c1-2) does not have a mercapto group and a hydroxyl group in a molecule.

It is preferable that the ring A is a monocyclic ring having 4 or more and 8 or less ring-forming atoms or a polycyclic ring having 5 or more and 20 or less ring-forming atoms, has a number of ring-forming atoms of 5 or more and 7 or less, and includes a nitrogen atom having 1 or more and 3 or less ring-forming atoms.

Examples of the organic group represented by $R^{1c}$, $R^{2c}$, $R^{3c}$, or $R^{4c}$ include an alkyl group having 1 or more and 30 or less carbon atoms, an alkenyl group having 2 or more and 30 or less carbon atoms, an alkynyl group having 2 or more and 30 or less carbon atoms, an aryl group having 6 or more and 30 or less carbon atoms, a heterocycle group having 4 or more and 30 or less carbon atoms, a carboxy group, and the like.

Examples of the compounds represented by the above (c1-1) include mercaptopyridine, mercaptopyrimidine, mercaptopyridazine, mercaptopyrazine, mercaptotriazine, mercaptoimidazole, mercaptotriazol, mercaptothiadiazole, mercaptobenzimidazole, and the like, each of which may be substituted.

Specific examples of the compounds represented by the above (c1-1) include 2-mercaptopyridine, 2-mercaptonicotinic acid, 2-mercaptopyrimidine, 4-mercaptopyrimidine, 3-mercaptopyridazine, 2-mercaptopyrazine, 2-mercapto-1,3,5-triazine, 3-mercapto-1,2,4-triazine, 2-mercaptoimidazole, 3-mercapto-1,2,4-triazol, 5-mercapto-1,2,4-triazol, 2-mercapto-1,3,4-thiadiazole, 2-mercaptobenzimidazole, and the like. Among these compounds represented by the above (c1-1), at least one selected from the group consisting of 2-mercaptopyridine, 2-mercaptonicotinic acid, 3-mercapto-1,2,4-triazol, and 2-mercapto-1,3,4-thiadiazole is preferable.

The compounds represented by the above (c1-1) may be used alone, or two or more kinds may be used in combination.

Furthermore, examples of the compounds represented by the above (c1-2) include thiolactam compounds, thiouracil derivatives, and tautomers of the compounds represented by the above (c1-1).

Specific examples of the thiolactam compounds include γ-thiobutyrolactam, δ-thiovalerolactam, ε-thiocaprolactam, and the like.

Specific examples of the thiouracil derivatives include 2-thiouracil, 5-methyl-2-thiouracil, 5,6-dimethyl-2-thiouracil, 6-ethyl-5-methyl-2-thiouracil, 6-methyl-5-n-propyl-2-thiouracil, 5-ethyl-2-thiouracil, 5-n-propyl-2-thiouracil, 5-n-butyl-2-thiouracil, 5-n-hexyl-2-thiouracil, 5-n-butyl-6- ethyl-2-thiouracil, 5-methoxy-2-thiouracil, 5-n-butoxy-2-thiouracil, 5-methoxy-6-n-propyl-2-thiouracil, 5-bromo-2-thiouracil, 5-chloro-2-thiouracil, 5-fluoro-2-thiouracil, 5-amino-2-thiouracil, 5-amino-6-methyl-2-thiouracil, 5-amino-6-phenyl-2-thiouracil, 5,6-diamino-2-thiouracil, 5-aryl-2-thiouracil, 5-aryl-3-ethyl-2-thiouracil, 5-aryl-6-phenyl-2-thiouracil, 5-benzyl-2-thiouracil, 5-benzyl-6-methyl-2-thiouracil, 5-acetamide-2-thiouracil, 6-methyl-5-nitro-2-thiouracil, 6-amino-2-thiouracil, 6-amino-5-methyl-2-thiouracil, 6-amino-5-n-propyl-2-thiouracil, 6-bromo-2-thiouracil, 6-chloro-2-thiouracil, 6-fluoro-2-thiouracil, 6-bromo-5-methyl-2-thiouracil, 6-acetamide-2-thiouracil, 6-n-octyl-2-thiouracil, 6-dodecyl-2-thiouracil, 6-tetradodecyl-2-thiouracil, 6-hexadecyl-2-thiouracil, 6-(3-isopropyloctyl)-5-methyl-2-thiouracil, 6-(m-nitrophenyl)-2-thiouracil, 6-(m-nitrophenyl)-5-n-propyl-2-thiouracil, 6-α-naphthyl-2-thiouracil, 6-α-naphthyl-5-t-butyl-2-thiouracil, 6-(p-chlorophenyl)-2-thiouracil, 6-(p-chlorophenyl)-2-ethyl-2-thiouracil, 5-ethyl-6-eicosyl-2-thiouracil, 6-acetamide-5-ethyl-2-thiouracil, 6-eicosyl-5-aryl-2-thiouracil, 5-amino-6-phenyl-2-thiouracil, 5-amino-6-(p-chlorophenyl)-2-thiouracil, 5-methoxy-6-phenyl-2-thiouracil, 5-ethyl-6-(3,3-dimethyl octyl)-2-thiouracil, 6-(2-bromoethyl)-2-thiouracil, and the like.

Among these compounds represented by the above (c1-2), thiolactam compound is preferable, and ε-thiocaprolactam is more preferable.

The compounds represented by the above (c1-2) may be used alone, or two or more kinds may be used in combination.

The content of the sulfur-containing compound (C1) is preferably 0.1 parts by mass or more and 99.9 parts by mass or less, more preferably 1 part by mass or more and 99 parts by mass or less, and further preferably 10 parts by mass or more and 90 parts by mass or less, relative to the total mass of 100 parts by mass of the sulfur-containing compound (C).

[Thiol Compound (C2)]

The thiol compound (C2) is not particularly limited as long as it has a mercapto group in a molecule and is different from the sulfur-containing compound (C1). As the thiol compound (C2), the below described first to third aspects of thiol compounds are preferable.

The first aspect of the thiol compound (C2) may include the compounds represented by the following formula (c2-1).

[Chem. 26]

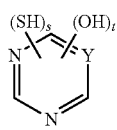

(c2-1)

In the above formula (c2-1), Y represents N or CH, s represents an integer of 1 or more and 3 or less, t represents an integer of 0 or more and 2 or less, and s+t is 2 or 3.

Specific examples of the compound represented by the above formula (c2-1) include 2,4-dimercapto-1,3,5-triazine, 2,4,6-trimercapto-1,3,5-triazine, 2,4-dimercapto-1,3,5-triazine-6-ol, 2-mercapto-1,3,5-triazine-4,6-diol, 2,4-dimercaptopyrimidine, 2-mercaptopyrimidine-4-ol, 2-mercaptopyrimidine-4,6-diol, and the like.

The second aspect of the thiol compound (C2) may include the compounds represented by the following formula (c2-2).

[Chem. 27]

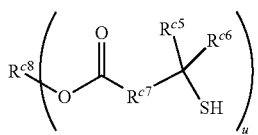

(c2-2)

In the above formula (c2-2), $R^{c5}$ and $R^{c6}$ each independently represents a hydrogen atom or an alkyl group, $R^{c7}$ represents a single bond or an alkylene group, $R^{c8}$ represents an aliphatic group having a valence of u, which may include an atom other than a carbon atom, and u is an integer of 2 or more and 4 or less.

When $R^{c5}$ or $R^{c6}$ is an alkyl group, it may be linear or branched alkyl group, and is preferably a linear alkyl group. When $R^{c5}$ or $R^{c6}$ is an alkyl group, the number of carbon atoms of the alkyl group is preferably 1 or more and 4 or less, more preferably 1 or 2, and further preferably 1. As the combination of $R^{c5}$ and $R^{c6}$, a combination in which one is a hydrogen atom and the other is an alkyl group is preferable, and a combination in which one is a hydrogen atom and the other is methyl group is more preferable.

When $R^{c7}$ is an alkylene group, the alkylene group may be a linear or branched alkylene group, and a linear alkylene group is preferable. When $R^{c7}$ is an alkylene group, the number of carbon atoms of the alkylene group is preferably 1 or more and 10 or less, more preferably 1 or more and 5 or less, further preferably 1 or 2, and particularly preferably 1.

$R^{c8}$ is an aliphatic group having a valence of 2 or more and 4 or less, which may include an atom other than carbon atom. As the atoms other than carbon atom which $R^{c7}$ may include, a nitrogen atom, an oxygen atom, a sulfur atom, a fluorine atom, a chlorine atom, a bromine atom, an iodine atom, and the like, are exemplified. The aliphatic group as $R^{c7}$ may be a linear or branched or cyclic group, and may have a structure including these structures.

Among the compounds represented by the above formula (c2-2), compounds represented by the following formula (c2-2-1) are preferable. In the following formula (c2-2-1), $R^{c8}$ and u are the same meanings of $R^{c8}$ and u in the above formula (c2-2).

[Chem. 28]

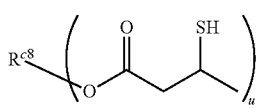

(c2-2-1)

Among the compounds represented by the above formula (c2-2-1), the compounds represented by the following formulae (c2-2-2) to (c2-2-4) are preferable.

[Chem. 29]

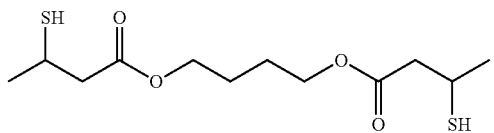

(c2-2-2)

(c2-2-3)

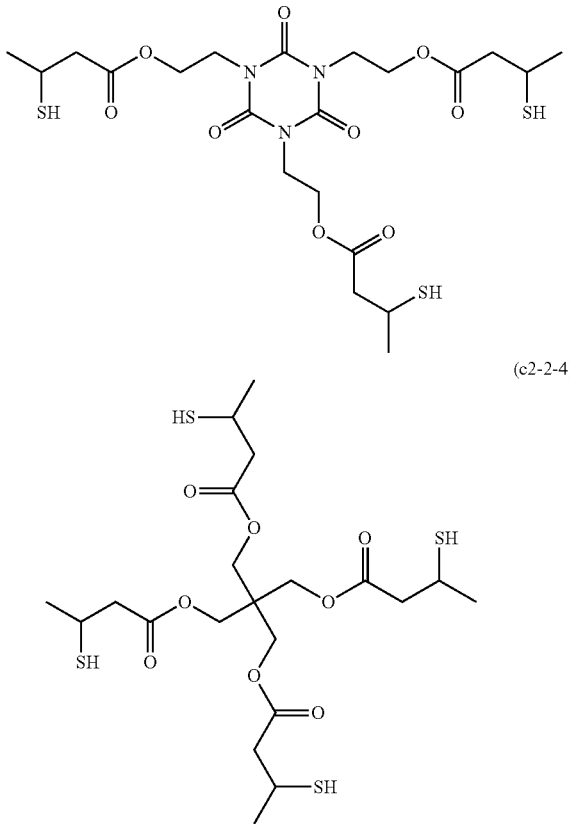

(c2-2-4)

Examples of the thiol compound (C2) in the third aspect include aromatic polythiol compounds such as 1,2-benzenedithiol, 1,3-benzenedithiol, 1,4-benzenedithiol, 1,2-bis(mercaptomethyl)benzene, 1,3-bis(mercaptomethyl)benzene, 1,4-bis(mercaptomethyl)benzene, 1,2-bis(mercapto ethyl)benzene, 1,3-bis(mercapto ethyl)benzene, 1,4-bis(mercapto ethyl)benzene, 1,2,3-trimercapto benzene, 1,2,4-trimercapto benzene, 1,3,5-trimercapto benzene, 1,2,3-tris(mercaptomethyl)benzene, 1,2,4-tris(mercaptomethyl)benzene, 1,3,5-tris(mercaptomethyl)benzene, 1,2,3-tris(mercaptoethyl)benzene, 1,2,4-tris(mercapto ethyl)benzene, 1,3,5-tris(mercaptoethyl)benzene, 2,5-toluenedithiol, 3,4-toluenedithiol, 1,3-di(p-methoxyphenyl)propane-2,2-dithiol, 1,3-diphenyl propane-2,2-dithiol, phenylmethane-1,1-dithiol, 2,4-di(p-mercaptophenyl)pentane, 1,2-bis(mercaptoethylthio)benzene, 1,3-bis(mercaptoethylthio)benzene, 1,4-bis(mercaptoethylthio)benzene, 1,2,3-tris(mercaptomethylthio)benzene, 1,2,4-tris(mercaptomethylthio)benzene, 1,3,5-tris(mercaptomethylthio)benzene, 1,2,3-tris(mercaptoethylthio)benzene, 1,2,4-tris(mercaptoethylthio)benzene, and 1,3,5-tris(mercaptoethylthio)benzene.

Among these thiol compounds (C2), at least one selected from the group consisting of 2,4,6-trimercapto-1,3,5-triazine, 2-mercapto-1,3,5-triazine-4,6-diol, 2,4-dimercaptopyrimidine, compounds represented by the above formulae (c2-2-2) to (c2-2-4), and 1,4-bis(mercaptomethyl)benzene is preferable.

These thiol compounds (C2) may be used alone, or two or more kinds may be used in combination.

The content of the thiol compound (C2) is preferably 0.1 parts by mass or more and 99.9 parts by mass or less, more preferably 1 part by mass or more and 99 parts by mass or less, and further preferably 10 parts by mass or more and 90 parts by mass or less, relative to the total mass of 100 parts by mass of the sulfur-containing compound (C).

The sulfur-containing compound (C) is preferably 0.01 parts by mass or more and 5 parts by mass or less, and more preferably 0.05 parts by mass or more and 2 parts by mass or less, relative to the total 100 parts by mass of the above resin (B) and the below alkali soluble resin (D).

<Alkali Soluble Resin (D)>

It is preferable that the photosensitive resin composition further contains an alkali-soluble resin (D) in order to improve crack resistance. The alkali-soluble resin as referred to herein may be determined as follows. A solution of the resin to give a resin concentration of 20% by mass (solvent: propylene glycol monomethyl ether acetate) is used to form a resin film having a film thickness of 1 μm on a substrate, and immersed in a 2.38% by mass aqueous TMAH solution for 1 min. If the resin was dissolved in an amount of no less than 0.01 μm, the resin is defined to be alkali soluble. The alkali-soluble resin (D) is preferably at least one selected from the group consisting of novolak resin (D1), polyhydroxystyrene resin (D2) and acrylic resin (D3).

[Novolak Resin (D1)]

The novolak resin (D1) may be prepared by addition condensation between, for example, aromatic compounds having a phenolic hydroxyl group (hereinafter, merely referred to as "phenols") and aldehydes in the presence of an acid catalyst.

Examples of the phenols include phenol, o-cresol, m-cresol, p-cresol, o-ethylphenol, m-ethylphenol, p-ethylphenol, o-butylphenol, m-butylphenol, p-butylphenol, 2,3-xylenol, 2,4-xylenol, 2,5-xylenol, 2,6-xylenol, 3,4-xylenol, 3,5-xylenol, 2,3,5-trimethyl phenol, 3,4,5-trimethyl phenol, p-phenylphenol, resorcinol, hydroquinone, hydroquinone monomethyl ether, pyrogallol, phloroglycinol, hydroxydiphenyl, bisphenol A, gallic acid, gallic acid ester, α-naphthol, β-naphthol, and the like. Examples of the aldehydes include formaldehyde, furfural, benzaldehyde, nitrobenzaldehyde, acetaldehyde, and the like. The catalyst used in the addition condensation reaction, which is not specifically limited, is exemplified by hydrochloric acid, nitric acid, sulfuric acid, formic acid, oxalic acid, acetic acid, etc., in regards to acid catalyst.

The flexibility of the novolak resins can be enhanced still more when o-cresol is used, a hydrogen atom of a hydroxide group in the resins is substituted with other substituents, or bulky aldehydes are used.

The mass average molecular weight of the novolak resin (D1) is preferably 1,000 or more and 50,000 or less.

[Polyhydroxystyrene Resin (D2)]

The hydroxystyrene compound to constitute the polyhydroxystyrene resin (D2) is exemplified by p-hydroxystyrene, α-methylhydroxystyrene, α-ethylhydroxystyrene, and the like. Among these, the polyhydroxystyrene resin (D2) is preferably prepared to give a copolymer with a styrene resin. The styrene compound to constitute the styrene resin is exemplified by styrene, chlorostyrene, chloromethylstyrene, vinyltoluene, α-methylstyrene, and the like.

Furthermore, the polyhydroxystyrene resin (D2) may include a structural unit derived from the other polymerizable compound in order to moderately control physical or chemical properties. Examples of such a structural unit include structural units represented by the above formulae (b5) to (b7).

The mass average molecular weight of the polyhydroxystyrene resin (D2) is preferably 1,000 or more and 50,000 or less.

[Acrylic Resin (D3)]

It is preferable that the acrylic resin (D3) includes a structural unit derived from a polymerizable compound having an ether linkage, and a structural unit derived from a polymerizable compound having a carboxy group.

Examples of the polymerizable compound having an ether linkage include (meth)acrylic acid derivatives having an ether linkage and an ester linkage such as 2-methoxyethyl (meth)acrylate, methoxytriethylene glycol (meth)acrylate, 3-methoxybutyl (meth)acrylate, ethylcarbitol (meth)acrylate, phenoxypolyethylene glycol (meth)acrylate, methoxypolypropylene glycol (meth)acrylate, tetrahydrofurfuryl (meth)acrylate, and the like. The polymerizable compound having an ether linkage is preferably, 2-methoxyethyl acrylate, or methoxytriethylene glycol acrylate. These polymerizable compounds may be used alone, or in combinations of two or more.

Examples of the polymerizable compound having a carboxyl group include monocarboxylic acids such as acrylic acid, methacrylic acid and crotonic acid; dicarboxylic acids such as maleic acid, fumaric acid and itaconic acid; compounds having a carboxyl group and an ester linkage such as 2-methacryloyloxyethyl succinic acid, 2-methacryloyloxyethyl maleic acid, 2-methacryloyloxyethyl phthalic acid and 2-methacryloyloxyethyl hexahydrophthalic acid. The polymerizable compound having a carboxyl group is preferably, acrylic acid and methacrylic acid. These polymerizable compounds may be used alone, or in combinations of two or more thereof.

The mass average molecular weight of the acrylic resin (D3) is preferably 50,000 to 800,000.

These alkali-soluble resins (D) may be used alone, or two or more kinds may be used in combination. The content of alkali-soluble resin (D) is preferably 0 parts by mass or more and 80 parts by mass or less, and more preferably 0 parts by mass or more and 70 parts by mass or less, relative to the total 100 parts by mass of the above resin (B) and the below-mentioned alkali soluble resin (D).

<Acid Diffusion Control Agent (E)>

In order to improve a shape of a resist pattern to be used as a template, the post-exposure delay stability and the like, of the photo sensitive resin layer, it is preferable that the photosensitive resin composition further contains an acid diffusion control agent (E). The acid diffusion control agent (E) is preferably an anitrogen-containing compound (E1), and an organic carboxylic acid, or an oxo acid of phosphorus or a derivative thereof (E2) may be further included as needed.

[Nitrogen-Containing Compound (E1)]

Examples of the nitrogen-containing compound (E1) include trimethylamine, diethylamine, triethylamine, di-n-propylamine, tri-n-propylamine, tri-n-pentylamine, tribenzylamine, diethanolamine, triethanolamine, n-hexylamine, n-heptylamine, n-octylamine, n-nonylamine, ethylenediamine, N,N,N',N'-tetramethylethylenediamine, tetramethylenediamine, hexamethylenediamine, 4,4'-diaminodiphenylmethane, 4,4'-diaminodiphenyl ether, 4,4'-diaminobenzophenone, 4,4'-diaminodiphenylamine, formamide, N-methylformamide, N,N-dimethylformamide, acetamide, N-methylacetamide, N,N-dimethylacetamide, propionamide, benzamide, pyrrolidone, N-methylpyrrolidone, methylurea, 1,1-dimethylurea, 1,3-dimethylurea, 1,1,3,3,-tetramethylurea, 1,3-diphenylurea, imidazole, benzimidazole, 4-methylimidazole, 8-oxyquinoline, acridine, purine, pyrrolidine, piperidine, 2,4,6-tri (2-pyridyl)-S-triazine, morpholine, 4-methylmorpholine, piperazine, 1,4-dimethylpiperazine, 1,4-diazabicyclo[2.2.2]octane, pyridine, and the like. These may be used alone, or in combinations of two or more thereof.

The content of the nitrogen-containing compound (E1) is preferably 0 parts by mass or more and 5 parts by mass or less, and more preferably 0 parts by mass or more and 3 parts by mass or less, relative to the total mass of 100 parts by mass of the above resin (B) and the above alkali soluble resin (D).

[Organic Carboxylic Acid or Oxo Acid of Phosphorus or Derivative Thereof (E2)]

Among the organic carboxylic acid, or the oxo acid of phosphorus or the derivative thereof (E2), preferred examples of the organic carboxylic acid include malonic acid, citric acid, malic acid, succinic acid, benzoic acid, salicylic acid and the like, and salicylic acid is particularly preferred.

Examples of the oxo acid of phosphorus or derivatives thereof include phosphoric acid and derivatives such as esters thereof such as, e.g., phosphoric acid, phosphoric acid di-n-butyl ester, and phosphoric acid diphenyl ester; phosphonic acid and derivatives such as esters thereof such as, e.g., phosphonic acid, phosphonic acid dimethyl ester, phosphonic acid di-n-butyl ester, phenylphosphonic acid, phosphonic acid diphenyl ester, and phosphonic acid dibenzyl ester; and phosphinic acid and derivatives such as esters thereof such as, e.g., phosphinic acid and phenylphosphinic acid; and the like. Among these, phosphonic acid is preferred. These may be used alone, or in combinations of two or more thereof.

The content of the organic carboxylic acid, or the oxo acid of phosphorus or the derivative thereof (E2) is preferably 0 parts by mass or more and 5 parts by mass or less, and more preferably 0 parts by mass or more and 3 parts by mass or less, relative to the total mass of 100 parts by mass of the above resin (B) and the above alkali soluble resin (D).

Moreover, in order to form a salt to allow for stabilization, the organic carboxylic acid, or the oxo acid of phosphorous or the derivative thereof (E2) is preferably used in an amount equivalent to that of the nitrogen-containing compound (E1).

<Organic Solvent (S)>

The photosensitive resin composition contains an organic solvent (S). The kind of the organic solvent (S) is not particularly limited, and the organic solvent can be appropriately selected for use from the organic solvents that have been conventionally used in positive-type photosensitive resin compositions.

Specific examples of the organic solvent (S) include ketones such as acetone, methyl ethyl ketone, cyclohexanone, methyl isoamyl ketone, and 2-heptanone; polyhydric alcohols and derivatives thereof, like monomethyl ethers, monoethyl ethers, monopropyl ethers, monobutyl ethers and monophenyl ethers, such as ethylene glycol, ethylene glycol monoacetate, diethylene glycol, diethylene glycol monoacetate, propylene glycol, propylene glycol monoacetate, dipropylene glycol and dipropylene glycol monoacetate; cyclic ethers such as dioxane; esters such as ethyl formate, methyl lactate, ethyl lactate, methyl acetate, ethyl acetate, butyl acetate, methyl pyruvate, methyl acetoacetate, ethyl acetoacetate, methyl pyruvate, ethylmethoxy acetate, methyl methoxypropionate, ethyl ethoxypropionate, methyl 2-hydroxypropionate, ethyl 2-hydroxypropionate, ethyl 2-hydroxy-2-methylpropionate, methyl 2-hydroxy-3-methylbutanate, 3-methoxybutyl acetate, and 3-methyl-3-methoxybutyl acetate; aromatic hydrocarbons such as toluene and xylene; and the like. These may be used alone, or as a mixture of two or more thereof.

The content of the organic solvent (S) is not particularly limited, and is, for example, the content such that the solid content concentration of the photosensitive resin composition is 30% by mass or more and 55% by mass or less.

<Other Components>

The photosensitive resin composition may further contain a polyvinyl resin for improving plasticity. Specific examples of the polyvinyl resin include polyvinyl chloride, polystyrene, polyhydroxystyrene, polyvinyl acetate, polyvinylbenzoic acid, polyvinyl methyl ether, polyvinyl ethyl ether, polyvinyl alcohol, polyvinyl pyrrolidone, polyvinyl phenol, and copolymers thereof, and the like. The polyvinyl resin is preferably polyvinyl methyl ether in view of lower glass transition temperatures.

Further, the photosensitive resin composition may also contain an adhesive auxiliary agent in order to improve the adhesiveness between a template formed with the photosensitive resin composition and a metal substrate.

Also, the photosensitive resin composition may further contain a surfactant for improving coating characteristics, defoaming characteristics, leveling characteristics and the like. Specific examples of the surfactant include commercially available fluorochemical surfactants such as BM-1000 and BM-1100 (both manufactured by B. M-Chemie Co., Ltd.), Megafac F142D, Megafac F172, Megafac F173 and Megafac F183 (all manufactured by Dainippon Ink And Chemicals, Incorporated), Flolade FC-135, Flolade FC-170C, Flolade FC-430 and Flolade FC-431 (all manufactured by Sumitomo 3M Ltd.), Surflon S-112, Surflon S-113, Surflon S-131, Surflon S-141 and Surflon S-145 (all manufactured by Asahi Glass Co., Ltd.), SH-28PA, SH-190, SH-193, SZ-6032 and SF-8428 (all manufactured by Toray Silicone Co., Ltd.), commercially available silicone-based surfactant such as BYK306, BYK307, and BYK310 (all of which is manufactured by BYK), but not limited thereto.

Additionally, in order to finely adjust the solubility in a developing solution, the photosensitive resin composition may further contain an acid, an acid anhydride, or a solvent having a high boiling point.

Specific examples of the acid and acid anhydride include monocarboxylic acids such as acetic acid, propionic acid, n-butyric acid, isobutyric acid, n-valeric acid, isovaleric acid, benzoic acid, and cinnamic acid; hydroxymonocarboxylic acids such as lactic acid, 2-hydroxybutyric acid, 3-hydroxybutyric acid, salicylic acid, m-hydroxybenzoic acid, p-hydroxybenzoic acid, 2-hydroxycinnamic acid, 3-hydroxycinnamic acid, 4-hydroxycinnamic acid, 5-hydroxyisophthalic acid, and syringic acid; polyvalent carboxylic acids such as oxalic acid, succinic acid, glutaric acid, adipic acid, maleic acid, itaconic acid, hexahydrophthalic acid, phthalic acid, isophthalic acid, terephthalic acid, 1,2-cyclohexanedicarboxylic acid, 1,2,4-cyclohexanetricarboxylic acid, butanetetracarboxylic acid, trimellitic acid, pyromellitic acid, cyclopentanetetracarboxylic acid, butanetetracarboxylic acid, and 1,2,5,8-naphthalenetetracarboxylic acid; acid anhydrides such as itaconic anhydride, succinic anhydride, citraconic anhydride, dodecenylsuccinic anhydride, tricarbanilic anhydride, maleic anhydride, hexahydrophthalic anhydride, methyltetrahydrophthalic anhydride, Himic anhydride, 1,2,3,4-butanetetracarboxylic acid, cyclopentanetetracarboxylic dianhydride, phthalic anhydride, pyromellitic anhydride, trimellitic anhydride, benzophenonetetracarboxylic anhydride, ethylene glycol bis anhydrous trimellitate, and glycerin tris anhydrous trimellitate; and the like.

Furthermore, specific examples of the solvent having a high boiling point include N-methylformamide, N,N-dimethylformamide, N-methylformanilide, N-methylacetamide, N,N-dimethlyacetamide, N-methylpyrrolidone, dimethyl sulfoxide, benzyl ethyl ether, dihexyl ether, acetonyl acetone, isophorone, caproic acid, caprylic acid, 1-octanol, 1-nonanol, benzyl alcohol, benzyl acetate, ethyl benzoate, diethyl oxalate, diethyl maleate, γ-butyrolactone, ethylene carbonate, propylene carbonate, phenyl cellosolve acetate, and the like.

Moreover, the photosensitive resin composition may further contain a sensitizer for improving the sensitivity.

<Method for Preparing Photosensitive Resin Composition>

The photosensitive resin composition is prepared by mixing or stirring the above components by the common method. Machines which can be used for mixing or stirring the above components include dissolvers, homogenizers, 3-roll mills and the like. The resulting mixture obtained by uniformly mixing the above components may further be filtered through a mesh, a membrane filter and the like.

<<Method for Manufacturing Substrate with Template>>

There is no particular limitation for the method for forming a resist pattern serving as a template for forming a plated article on a metal surface of a substrate by using the aforementioned photosensitive resin composition. Preferable methods include a method for manufacturing a substrate with a template, including: forming a photosensitive resin layer including a photosensitive resin composition on a metal surface of a substrate having the metal surface, irradiating the photosensitive resin layer with an active ray or radiation to perform exposure, and developing the photosensitive resin layer after the exposure to create a template for forming a plated article.

There is no particular limitation for the substrate on which a photosensitive resin layer is formed, and conventionally known substrates can be used. Examples include substrates for electronic part, those on which a predetermined wire pattern is formed and the like. Those having a metal surface are used as the above substrate, and as metal species constituting a metal surface, copper, gold and aluminum are preferred, and copper is more preferred.

The photosensitive resin layer is formed on a substrate, for example, as follows. That is, a liquid photosensitive resin composition is applied on a substrate, and then a solvent is removed by heating to form a photosensitive resin layer having a desired film thickness. There is no particular limitation for the thickness of a photosensitive resin layer as long as it can form a resist pattern serving as a template which has a desired film thickness. There is no particular limitation for the film thickness, but the film thickness is preferably 1 μm or more, more preferably 2 μm or more and 150 μm or less, further preferably 3 μm or more and 120 μm or less, and particularly preferably 4 μm or more and 100 μm or less.

As a method for applying a photosensitive resin composition onto a substrate, methods such as a spin coating method, a slit coating method, a roll coating method, a screen printing method, and an applicator method can be used. Pre-baking is preferably performed on a photosensitive resin layer. The conditions of pre-baking may differ depending on the components in a photosensitive resin composition, the blending ratio, the thickness of a coating film and the like, but they are usually about 2 minutes or more and 60 minutes or less at 70° C. or more and 150° C. or less.

The photosensitive resin layer formed as described above is selectively irradiated (exposed) with an active ray or radiation, for example, an ultraviolet radiation or visible light with a wavelength of 300 nm or more and 500 nm or less through a mask having a predetermined pattern.

Low pressure mercury lamps, high pressure mercury lamps, super high pressure mercury lamps, metal halide lamps, argon gas lasers, etc. can be used for the light source of the radiation. The radiation may include micro waves, infrared rays, visible lights, ultraviolet rays, X-rays, γ-rays, electron beams, proton beams, neutron beams, ion beams, etc. The irradiation dose of the radiation may vary depending on the constituent of the photosensitive resin composition, the film thickness of the photosensitive resin layer, and the like. For example, when an ultra high-pressure mercury lamp is used, the dose may be 100 mJ/cm$^2$ or more and 10,000 mJ/cm$^2$ or less. Furthermore, the radiation includes a light ray to activate the acid generator (A) in order to generate an acid.

After the exposure, the diffusion of acid is promoted by heating the photosensitive resin layer using a known method to change the alkali solubility of the photosensitive resin layer at an exposed portion of the photosensitive resin film.

Subsequently, the exposed photosensitive resin layer is developed in accordance with a conventionally known method, and an insoluble portion is dissolved and removed to form a predetermined resist pattern. At this time, an alkaline aqueous solution is used as a developing solution.

As the developing solution, an aqueous solution of an alkali such as, for example, sodium hydroxide, potassium hydroxide, sodium carbonate, sodium silicate, sodium metasilicate, aqueous ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, 1,8-diazabicyclo[5.4.0]-7-undecene or 1,5-diazabicyclo[4.3.0]-5-nonane can be used. Also, an aqueous solution prepared by adding an adequate amount of a water-soluble organic solvent such as methanol or ethanol, or a surfactant to the aqueous solution of the alkali can be used as the developing solution.

The developing time may vary depending on the constituent of the photosensitive resin composition, the film thickness of the photosensitive resin layer, and the like. Usually, the developing time is 1 minute or more and 30 minutes or less. The method of the development may be any one of a liquid-filling method, a dipping method, a paddle method, a spray developing method, and the like.

After development, it is washed with running water for 30 seconds or more and 90 seconds or less, and then dried with an air gun, an oven and the like. As described above, a substrate having a resist pattern serving as a template on a metal surface of a substrate can be manufactured.

<<Method for Manufacturing Plated Article>>

A conductor such as a metal may be embedded by plating, into a nonresist section (a portion removed with a developing solution) in a template of a substrate with the template formed by the above method on the substrate to form a plated article, for example, like a connecting terminal such as a bump and a metal post. Note that there is no particular limitation for the method of plate processing, and various conventionally known methods can be used. As a plating liquid, in particular, a solder plating liquid, a copper plating liquid, a gold plating liquid and a nickel plating liquid are suitably used. Finally, the remaining template is removed with a stripping liquid and the like in accordance with a conventional method.

EXAMPLES

Below, the present invention will be described in more detail with reference to Examples, but the present invention shall not be limited to these Examples.

Examples 1 to 10 and Comparative Examples 1 to 5

[Preparation of Photosensitive Resin Composition]

The following acid generator A1 was used as an acid generator (A).

[Chem. 30]

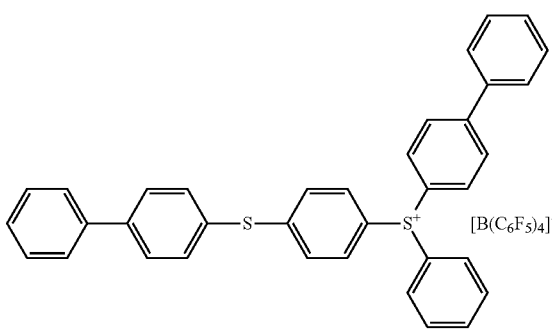

(A1)

A mixture including the following resin B1-1 (mass average molecular weight: 36000, dispersivity: 2.4) and resin B1-2 (mass average molecular weight: 45000, dispersivity: 2.8) in a mass ratio of 1:1 (collectively referred to as "resin B1") was used as a resin (B).

The number at the lower right of the parentheses in each constituent unit in the following structural formula represents the content (% by mass) of the constituent unit in each resin.

[Chem. 31]

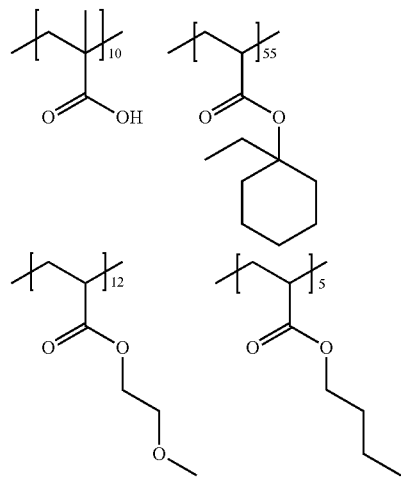

(B1-1)

-continued
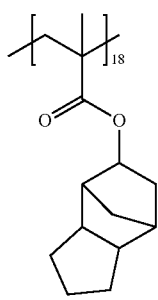
(B1-2)
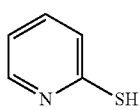
As the sulfur-containing compound (C1) represented by the specific formula in the sulfur-containing compound (C), the following sulfur-containing compounds C1-1 to C1-5 were used. As the thiol compound (C2), the following thiol compounds C2-1 to C2-6 were used.
[Chem. 32]
(C1-1)
(C1-2)
-continued
(C1-3)
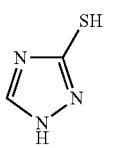
(C1-4)
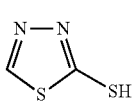
(C1-5)
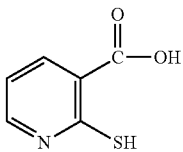
(C2-1)
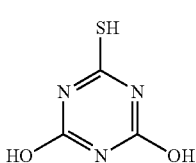
(C2-2)
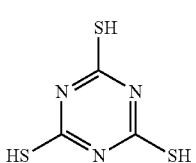
(C2-3)
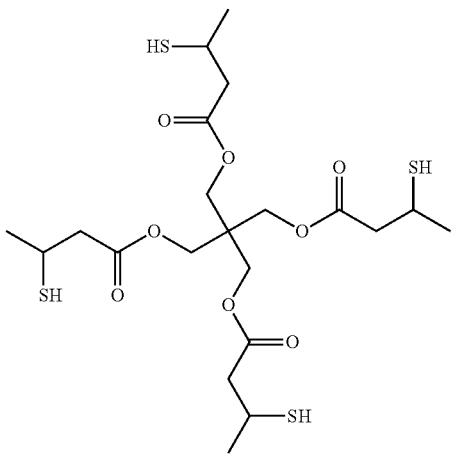
(C2-4)
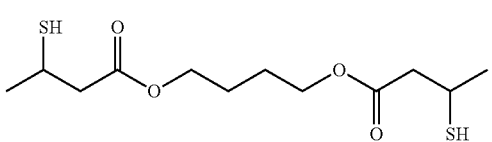
(C2-5)
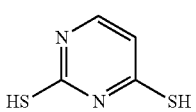

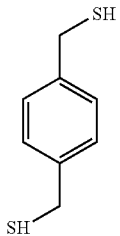
(C2-6)

As a comparative compound (C3) as an alternative to the sulfur-containing compound (C), the following comparative compounds C3-1 to C3-3 were used.

[Chem. 33]

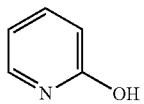
(C3-1)

(C3-2)

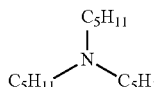
(C3-3)

As the alkali soluble resins (D), the following resins D1 and D2 were used.

D1: A copolymer of polyhydroxystyrene resin (p-hydroxy styrene/styrene=75/25 (mass ratio), mass-average molecular weight: 2500)

D2: A novolak resin (a novolak resin obtained by mixing m-cresol and p-cresol in m-cresol/p-cresol=60/40 (mass ratio), and performing addition condensation in the presence of formaldehyde and an acid catalyst (mass-average molecular weight: 8000, dispersivity: 2.6)

Two parts by mass of acid generator A1, 30 parts by mass of resin B1, 20 parts by mass of resin D1, 50 parts by mass of resin D2, a sulfur-containing compound (C1) or a comparative compound (C3) in types and amounts (part by mass) described in Tables 1 and 2, and a thiol compound (C2) in types and amounts (parts by mass) described in Tables 1 and 2 were dissolved in 3-methoxy butyl acetate (MA) so that the solid content concentration became 51% by mass to obtain photosensitive resin compositions of Examples 1 to 10 and Comparative Examples 1 to 5.

Note here that "—" in Tables 1 and 2 shows that the component is not contained. Example 1 in Table 1 is repeated to be described as Example 1 in Table 2 for convenience of comparison.

[Evaluation]

The obtained photosensitive resin composition was evaluated in terms of the cross-sectional perpendicularity of a nonresist section according to the following method. Firstly, photosensitive resin compositions from Examples 1 to 10 and Comparative Examples 1 to 5 were each applied on a surface of a substrate having titanium and copper stacked in this order on a silicon wafer so as to form a photosensitive resin layer having a film thickness of 50 µm. Then, the photosensitive resin layers were pre-baked for 100 seconds at 100° C., and then pre-baked for 300 seconds at 150° C. After the pre-baking, using a mask having a hole pattern with a diameter of 10 µm and an exposure device Prisma GHI (manufactured by Ultratech Inc.), pattern exposure was performed with the ghi line at an exposure level 1.2 times as great as the minimum necessary exposure level for formation of resist pattern. Subsequently, the substrate was mounted on a hot plate to perform post-exposure baking (PEB) for 180 seconds at 100° C. Then, a 2.38% by mass aqueous solution of tetramethylammonium hydroxide (a developing solution, NMD-3, manufactured by Tokyo Ohka Kogyo Co., Ltd.) was added dropwise to the developed photosensitive resin layer, and allowed to stand for 60 seconds at 23° C. This was repeated the total of 4 times. Thereafter, the surface of the resist pattern was washed with running water, and blown with nitrogen to obtain a resist pattern.

The cross-sectional shape of the obtained resist pattern was observed under a scanning electron microscope to measure the diameter of the nonresist section (hole) in 36 sections in the film thickness direction. Then, the case where a difference between the maximum value (CD-Max) and the minimum value (CD-Min) is less than 1.0 µm was evaluated as "○" and the case where the difference is 1.0 µm or more was evaluated as "X". Evaluation results are shown in Tables 1 and 2.

TABLE 1

| | Sulfur-containing compound (C1) | Thiol compound (C2) | Comparative compound (C3) | Cross-sectional perpendicularity of nonresist section |
|---|---|---|---|---|
| Example 1 | C1-1 (0.02 parts by mass) | C2-1 (0.05 parts by mass) | — | ○ |
| Example 2 | C1-2 (0.02 parts by mass) | C2-1 (0.05 parts by mass) | — | ○ |
| Example 3 | C1-3 (0.02 parts by mass) | C2-1 (0.05 parts by mass) | — | ○ |
| Example 4 | C1-4 (0.02 parts by mass) | C2-1 (0.05 parts by mass) | — | ○ |
| Example 5 | C1-5 (0.02 parts by mass) | C2-1 (0.05 parts by mass) | — | ○ |
| Comparative Example 1 | — | C2-1 (0.05 parts by mass) | C3-1 (0.02 parts by mass) | X |
| Comparative Example 2 | — | C2-1 (0.05 parts by mass) | C3-2 (0.02 parts by mass) | X |
| Comparative Example 3 | — | C2-1 (0.05 parts by mass) | C3-3 (0.02 parts by mass) | X |
| Comparative Example 4 | C1-1 (0.02 parts by mass) | — | — | X |

TABLE 2

| | Sulfur-containing compound (C1) | Thiol compound (C2) | Comparative compound (C3) | Cross-sectional perpendicularity of nonresist section |
|---|---|---|---|---|
| Example 1 | C1-1 (0.02 parts by mass) | C2-1 (0.05 parts by mass) | — | ○ |
| Example 6 | C1-1 (0.03 parts by mass) | C2-2 (0.05 parts by mass) | — | ○ |
| Example 7 | C1-1 (0.04 parts by mass) | C2-3 (0.05 parts by mass) | — | ○ |
| Example 8 | C1-1 (0.05 parts by mass) | C2-4 (0.05 parts by mass) | — | ○ |
| Example 9 | C1-1 (0.06 parts by mass) | C2-5 (0.05 parts by mass) | — | ○ |
| Example 10 | C1-1 (0.07 parts by mass) | C2-6 (0.05 parts by mass) | — | ○ |
| Comparative Example 5 | — | C2-1 (0.05 parts by mass) | C3-1 (0.08 parts by mass) | X |

As is apparent from Tables 1 and 2, in Examples 1 to 10 using photosensitive resin compositions containing specific sulfur-containing compounds (C1) and specific thiol compounds (C2), even when a resist pattern is formed on a metal surface, a resist pattern having excellent cross-sectional perpendicularity of a nonresist section can be formed. On the other hand, Comparative Examples 1 to 3, and 5 using photosensitive resin compositions containing comparative compounds (C3) instead of the specific sulfur-containing compounds (C1), and Comparative Example 4 using a photosensitive resin composition which does not contain specific thiol compounds (C2), the cross-sectional perpendicularity of a nonresist section is poorer than Examples 1 to 10.

Examples 11, 12 and Comparative Examples 6 to 10

[Preparation of Photosensitive Resin Composition]

As the acid generator (A), the following acid generator A2 was used.

[Chem. 34]

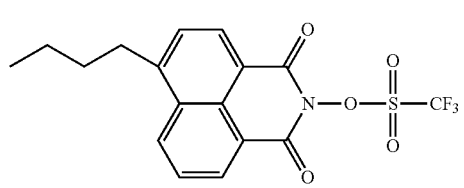

(A2)

As the resin (B), the following resin B2 (mass average molecular weight: 103000) was used. The number at the lower right of the parentheses in each structural unit of the following structural formula represents the content (% by mass) of the constituent unit in each resin.

[Chem. 35]

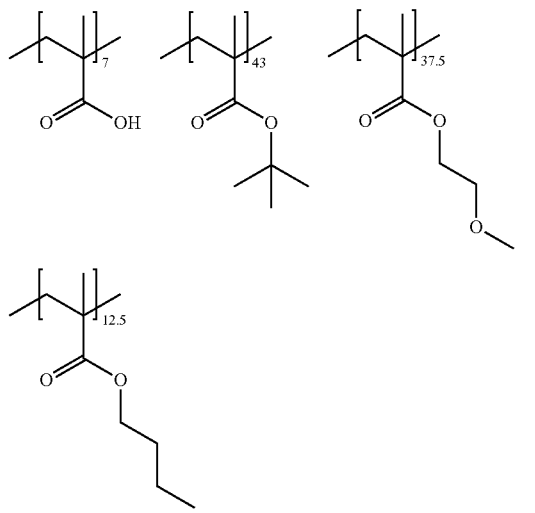

(B2)

Among the sulfur-containing compounds (C), as the sulfur-containing compound (C1) represented by the specific formula, the following sulfur-containing compounds C1-1 and C1-3 were used, and as the thiol compound (C2), the following thiol compound C2-1 was used.

[Chem. 36]

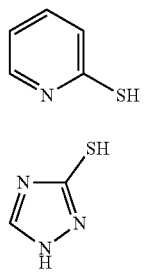

(C1-1)

(C1-3)

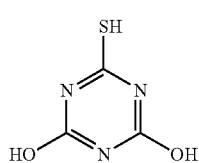

(C2-1)

As a comparative compound (C3) as an alternative to the sulfur-containing compound (C), the following comparative compounds C3-1, and C3-4 to C3-7 were used.

[Chem. 37]

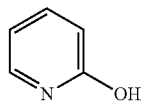

(C3-1)

-continued

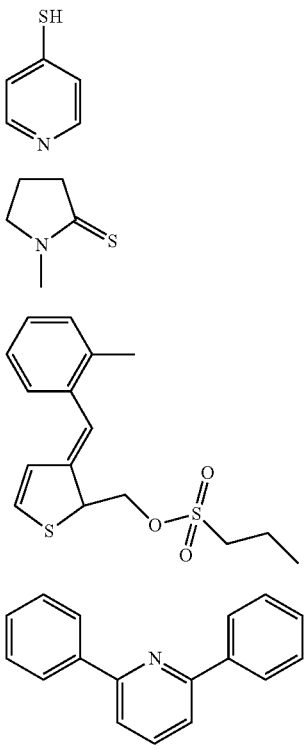

The following resins D3 to D5 were used as the alkali soluble resins (D).
D3: A copolymer of polyhydroxystyrene resin (p-hydroxystyrene/styrene/tert-butyl acrylate=60/15/25 (mass ratio), mass-average molecular weight: 10000)
D4: A novolak resin (a novolak resin obtained by mixing m-cresol and p-cresol in m-cresol/p-cresol=40/60 (mass ratio), and performing addition condensation in the presence of formaldehyde and an acid catalyst (mass-average molecular weight: 5000)
D5: A novolak resin (a novolak resin obtained by mixing m-cresol and p-cresol in m-cresol/p-cresol=40/60 (mass ratio), and performing addition condensation in the presence of formaldehyde and an acid catalyst (mass-average molecular weight: 7000)

One part by mass of acid generator A2, 35 parts by mass of resin B2, 10 parts by mass of resin D3, 27.5 parts by mass of resin D4, 27.5 parts by mass of resin D5, a sulfur-containing compound (C1) or a comparative compound (C3) in types and amounts (parts by mass) described in Table 3, a thiol compound (C2) in types and amounts (parts by mass) described in Table 3, and 0.05 parts by mass of surfactant (BYK310, manufactured by BYK) were dissolved in a mix solvent including 3-methoxy butyl acetate (MA) and propylene glycol monomethyl ether acetate (PM) (MA/PM=6/4 (volume ratio)) so that the solid content concentration became 40% by mass to obtain each photosensitive resin composition of Examples 11 and 12 and Comparative Examples 6 to 10. Note here that "-" in Table 3 shows that the component is not contained.

[Evaluation]

The obtained photosensitive resin composition was evaluated in terms of the cross-sectional perpendicularity of a nonresist section according to the following method. Firstly, photosensitive resin compositions from Examples 11 and 12 and Comparative Examples 6 to 10 were each applied on a surface of a substrate having titanium and copper stacked in this order on a silicon wafer so as to form a photosensitive resin layer having a film thickness of 8 μm. Then the photosensitive resin layers were pre-baked for 300 seconds at 120° C. After the pre-baking, using a mask having a line and space pattern with a line width of 2 μm and a space width of 2 μm and an exposure device Prisma GHI (manufactured by Ultratech Inc.), pattern exposure was performed with the ghi line at an exposure level 1.2 times as great as the minimum necessary exposure level for formation of the resist pattern. Subsequently, the substrate was mounted on a hot plate to perform post-exposure baking (PEB) for 90 seconds at 90° C. Then, a 2.38% by mass aqueous solution of tetramethylammonium hydroxide (a developing solution, NMD-3, manufactured by Tokyo Ohka Kogyo Co., Ltd.) was added dropwise to the developed photosensitive resin layer, and allowed to stand for 30 seconds at 23° C. This was repeated the total of twice. Thereafter, the surface of the resist pattern was washed with running water, and blown with nitrogen to obtain a resist pattern.

The cross-sectional shape of the obtained resist pattern was observed under a scanning electron microscope to measure a taper angle (an angle made by the bottom surface and the side surface of the line) of the resist section (line). Then, the case where the taper angle was 88° or more was evaluated as "O" and the case where the taper angle was less than 88° was evaluated as "X". Evaluation results are shown in Table 3.

TABLE 3

| | Sulfur-containing compound (C1) | Thiol compound (C2) | Comparative compound (C3) | Cross-sectional perpendicularity of nonresist section |
|---|---|---|---|---|
| Example 11 | C1-1 (0.12 parts by mass) | C2-1 (0.05 parts by mass) | — | O |
| Example 12 | C1-3 (0.12 parts by mass) | C2-1 (0.05 parts by mass) | — | O |
| Comparative Example 6 | — | C2-1 (0.05 parts by mass) | C3-1 (0.12 parts by mass) | X |
| Comparative Example 7 | — | C2-1 (0.05 parts by mass) | C3-4 (0.12 parts by mass) | X |
| Comparative Example 8 | — | C2-1 (0.05 parts by mass) | C3-5 (0.12 parts by mass) | X |
| Comparative Example 9 | — | C2-1 (0.05 parts by mass) | C3-6 (0.12 parts by mass) | X |
| Comparative Example 10 | — | C2-1 (0.05 parts by mass) | C3-7 (0.12 parts by mass) | X |

As is apparent from Table 3, in Examples 11 and 12 using photosensitive resin compositions containing specific sulfur-containing compounds (C1) and specific thiol compounds (C2), even when a resist pattern is formed on a metal surface, a resist pattern having excellent cross-sectional perpendicularity of a nonresist section can be formed. On the other hand, Comparative Examples 6 to 10 using photosensitive resin compositions containing comparative compounds (C3) instead of the specific sulfur-containing compounds (C1), the cross-sectional perpendicularity of a nonresist section is poorer than Examples 11 and 12.

Examples 13, 14

[Preparation of Photosensitive Resin Composition]

As the acid generator (A), the above acid generator A2 was used. As the resin (B), the above resin B2 was used. Among the sulfur-containing compounds (C), as the sulfur-containing compound (C1) represented by the specific formula, the above sulfur-containing compound C1-3 was used, and as the thiol compound (C2), the above thiol compounds C2-1 and C2-3 were used. As the alkali soluble resin (D), the above resins D3 to D5 were used.

One part by mass of acid generator A2, 35 parts by mass of resin B2, resins D3 to D5 in types and amounts (part by mass) described in Table 4, sulfur-containing compound (C1) in types and amounts (part by mass) described in Table 4, a thiol compound (C2) in types and amounts (parts by mass) described in Table 4, and 0.05 parts by mass of surfactant (BYK310, manufactured by BYK) were dissolved in a mix solvent including 3-methoxy butyl acetate (MA) and propylene glycol monomethyl ether acetate (PM) (MA/PM=6/4 (volume ratio)) so that the solid content concentration became 40% by mass to obtain each photosensitive resin composition of Examples 13 and 14.

[Evaluation]

The obtained photosensitive resin composition was evaluated in terms of the sensitivity of the photosensitive resin composition and the cross-sectional perpendicularity of a nonresist section according to the following method.

(Evaluation of Sensitivity)

Firstly, photosensitive resin compositions from Examples 13 and 14 were each applied on a surface of a substrate having titanium and copper stacked in this order on a silicon wafer so as to form a photosensitive resin layer having a film thickness of 8 µm. Then, the photosensitive resin layers were pre-baked for 300 seconds at 120° C. After the pre-baking, using a mask having a line and space pattern with a line width of 1.8 µm and a space width of 2 µm and an exposure device Prisma GHI (manufactured by Ultratech Inc.), pattern exposure was performed with the ghi line while the exposure level was changed in a stepwise manner. Subsequently, the substrate was mounted on a hot plate to perform post-exposure baking (PEB) for 90 seconds at 90° C. Then, a 2.38% by mass aqueous solution of tetramethylammonium hydroxide (a developing solution, NMD-3, manufactured by Tokyo Ohka Kogyo Co., Ltd.) was added dropwise to the developed photosensitive resin layer, and allowed to stand for 30 seconds at 23° C. This was repeated the total of twice. Subsequently, the surface of the resist pattern was washed with running water, and blown with nitrogen to obtain a resist pattern.

As described above, a resist pattern was formed while exposure level was changed in a stepwise manner, the exposure level at which pattern residues were not observed, that is, necessary minimum exposure level for formation of the resist pattern was obtained and used as a parameter of the sensitivity. Evaluation results are shown in Table 4.

(Evaluation of Cross-Sectional Perpendicularity of Nonresist Section)

Firstly, photosensitive resin compositions from Examples 13 and 14 were each applied on a surface of a substrate having titanium and copper stacked in this order on a silicon wafer so as to form a photosensitive resin layer having a film thickness of 8 µm. Then the photosensitive resin layers were pre-baked for 300 seconds at 120° C. After the pre-baking, using a mask having a line and space pattern with a line width of 1.8 µm and a space width of 2 µm and an exposure device Prisma GHI (manufactured by Ultratech Inc.), pattern exposure was performed with the ghi line at an exposure level 1.2 times as great as the minimum necessary exposure level for formation of the resist pattern. Subsequently, the substrate was mounted on a hot plate to perform post-exposure baking (PEB) for 90 seconds at 90° C. Then, a 2.38% by mass aqueous solution of tetramethylammonium hydroxide (a developing solution, NMD-3, manufactured by Tokyo Ohka Kogyo Co., Ltd.) was added dropwise to the developed photosensitive resin layer, and allowed to stand for 30 seconds at 23° C. This was repeated the total of twice. Thereafter, the surface of the resist pattern was washed with running water, and blown with nitrogen to obtain a resist pattern.

The cross-sectional shape of the obtained resist pattern was observed under a scanning electron microscope to measure a taper angle (an angle made by the bottom surface and the side surface of the line) of the resist section (line). Then, the case where the taper angle was 88° or more was evaluated as "O" and the case where the taper angle was less than 88° was evaluated as "X". Evaluation results are shown in Table 4.

TABLE 4

|  | Alkali soluble resins (D) | Sulfur-containing compound (C1) | Thiol compound (C2) | Sensitivity | Cross-sectional perpendicularity of nonresist section |
|---|---|---|---|---|---|
| Example 13 | D3 (10 parts by mass) D4 (27.5 parts by mass) D5 (27.5 parts by mass) | C1-3 (0.08 parts by mass) | C2-1 (0.05 parts by mass) | 350 mJ/cm$^2$ | O |
| Example 14 | D3 (10 parts by mass) | C1-3 (0.08 parts by mass) | C2-3 (0.05 parts by mass) | 400 mJ/cm$^2$ | O |

TABLE 4-continued

| Alkali soluble resins (D) | Sulfur-containing compound (C1) | Thiol compound (C2) | Sensitivity | Cross-sectional perpendicularity of nonresist section |
|---|---|---|---|---|
| D4 (27.5 parts by mass) D5 (27.5 parts by mass) | | | | |

As is apparent from Table 4, in Examples 13 and 14 using photosensitive resin compositions containing specific sulfur-containing compounds (C1) and specific thiol compounds (C2), even when a resist pattern is formed on a metal surface, a resist pattern having excellent cross-sectional perpendicularity of a nonresist section can be formed. In particular, Example 13 using a thiol compound C2-1 has more excellent sensitivity than that of Example 14 using a thiol compound C2-3.

What is claimed is:

1. A chemically amplified positive-type photosensitive resin composition comprising:
    an acid generator (A) that produces an acid by irradiation with an active ray or radiation;
    a resin (B) whose solubility in alkali increases under an action of acid;
    and a sulfur-containing compound (C), wherein the sulfur-containing compound (C) comprises a sulfur-containing compound (C1), and a thiol compound (C2) that is different from the sulfur-containing compound (C1), and
    wherein the sulfur-containing compound (C1) is a compound represented by at least one of the following formulae (c1-1) and (c1-2):

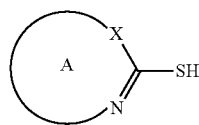
(c1-1)

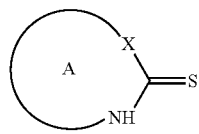
(c1-2)

wherein in the formulae (c1-1) and (c1-2), a ring A is a monocyclic ring having 4 or more and 8 or less ring-forming atoms, or a polycyclic ring having 5 or more and 20 or less ring-forming atoms, X is $-CR^{1c}R^{2c}-$, $-NR^{3c}-$, $-O-$, $-S-$, $-Se-$, $-Te-$, $=CR^{4c}-$, or $=N-$, and $R^{1c}$, $R^{2c}$, $R^{3c}$, and $R^{4c}$ each independently represents a hydrogen atom, a halogen atom, a nitro group, a cyano group, or an organic group,
wherein the compound represented by the formula (c1-1) has one mercapto group in a molecule, and does not have a hydroxyl group; and the compound represented by the formula (c1-2) does not have a mercapto group and a hydroxyl group in the molecule,
the composition comprises more than 0.05 and 2 parts by mass or less of the sulfur-containing compound (C) relative to 100 parts by mass of the resin (B), and
the composition comprises 0.05 parts by mass or more and less than 2 parts by mass of the thiol compound (C2) relative to 100 parts by mass of the resin (B).

2. The chemically amplified positive-type photosensitive resin composition according to claim 1, wherein a number of the ring-forming atoms in the ring A is 5 or more and 7 or less, and the ring A includes 1 or more and 3 or less nitrogen atoms as the ring-forming atoms.

3. The chemically amplified positive-type photosensitive resin composition according to claim 1, further comprising an alkali soluble resin (D).

4. The chemically amplified positive-type photosensitive resin composition according to claim 3, wherein the alkali soluble resin (D) comprises at least one resin selected from the group consisting of a novolak resin (D1), a polyhydroxystyrene resin (D2), and an acrylic resin (D3).

5. A method for manufacturing a substrate with a template, the method comprising:
    forming a photosensitive resin layer on a metal surface of a substrate having the metal surface, the photosensitive resin layer comprising the chemically amplified positive-type photosensitive resin composition according to claim 1;
    irradiating the photosensitive resin layer with an active ray or radiation to perform exposure; and
    developing the photosensitive resin layer after the exposure to create a template for forming a plated article.

6. A method for manufacturing a plated article, the method comprising plating the substrate with a template manufactured by the method according to claim 5 to form the plated article within the template.

7. The chemically amplified positive-type photosensitive resin composition according to claim 1, wherein the thiol compound (C2) comprises at least one selected from the group consisting of a compound represented by the following formula (c2-2) and a benzene-polythiol compound:

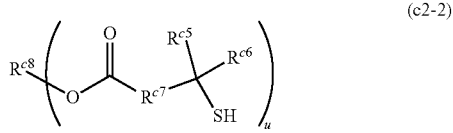
(c2-2)

wherein $R^{c5}$ and $R^{c6}$ each independently represents a hydrogen atom or an alkyl group, $R^{c7}$ represents a single bond or an alkylene group, $R^{c8}$ represents an aliphatic group having a valence of u, which may include an atom other than a carbon atom, and u is an integer of 2 or more and 4 or less, wherein the thiol compound (C2) does not include any tautomer of the sulfur-containing compound (C1), and wherein the benzene-polythiol compound comprises at least one selected from the group consisting of 1,2-bis(mercaptomethyl)benzene, 1,3-bis(mercaptomethyl)benzene, 1,4-bis(mercaptomethyl)benzene, 1,2-bis(mercaptoethyl)benzene, 1,3-bis(mercaptoethyl)benzene, 1,4-bis(mercaptoethyl)benzene, 1,2,3-trimercaptobenzene, 1,2,4-trimercaptobenzene, 1,3,5-trimercaptobenzene, 1,2,3-tris(mercaptomethyl)benzene, 1,2,4-tris(mercaptomethyl)benzene, 1,3,5-tris(mercaptomethyl)benzene, 1,2,3-tris(mercaptoethyl)benzene, 1,2,4-tris(mercaptoethyl)benzene, 1,3,5-tris(mercaptoethyl)benzene, 2,5-toluenedithiol, 3,4-toluenedithiol, 1,3-di(p-methoxyphenyl)propane-2,2-dithiol, 1,3-diphenylpropane-2,2-dithiol, phenylmethane-1,1-dithiol, 2,4-di(p-mercaptophenyl)pentane, 1,2-bis(mercaptoethylthio)benzene, 1,3-bis(mercaptoethylthio)benzene, 1,4-bis(mercaptoethylthio)benzene, 1,2,3-tris(mercaptomethylthio)benzene, 1,2,4-tris(mercaptomethylthio)benzene, 1,3,5-tris(mercaptomethylthio)benzene, 1,2,3-tris(mercaptoethylthio)benzene, 1,2,4-tris(mercaptoethylthio)benzene, and 1,3,5-tris(mercaptoethylthio)benzene.

* * * * *